(12) United States Patent
Takatsukasa

(10) Patent No.: US 11,606,103 B2
(45) Date of Patent: Mar. 14, 2023

(54) DATA COMPRESSION METHOD, DATA COMPRESSION DEVICE, DATA DECOMPRESSION METHOD, AND DATA DECOMPRESSION DEVICE

(71) Applicant: FUJI ELECTRIC CO., LTD., Kanagawa (JP)

(72) Inventor: Kenji Takatsukasa, Tokyo (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 58 days.

(21) Appl. No.: 17/443,369

(22) Filed: Jul. 26, 2021

(65) Prior Publication Data

US 2022/0085827 A1 Mar. 17, 2022

(30) Foreign Application Priority Data

Sep. 15, 2020 (JP) .............................. JP2020-155010

(51) Int. Cl.
*H03M 7/40* (2006.01)

(52) U.S. Cl.
CPC ................................... *H03M 7/40* (2013.01)

(58) Field of Classification Search
CPC .... H03M 7/3066; H03M 7/30; H03M 7/3059; H03M 7/46; H03M 7/70; H03M 7/40; H03M 7/48; H03M 7/6005; H03M 7/6023; H03M 7/607; H03M 1/12; H03M 13/1117; H03M 13/41; H03M 13/4107; H03M 13/6312; H03M 5/00; H03M 7/00; H03M 7/3024; H03M 7/3035; H03M 7/3068; H03M 7/3082; H03M 7/3084; H03M 7/3088; H03M 7/4037; H03M 7/60; H03M 7/6011; H03M 7/6029; H03M 7/6047; H03M 7/6064; H03M 7/6088; H03M 7/707; G06F 17/153; G06F 17/16; G06F 13/4027; G06F 13/426; G06F 16/2237; G06F 16/2291; G06F 3/0608; G06F 3/0661;
(Continued)

(56) References Cited

U.S. PATENT DOCUMENTS 5,771,011 A * 6/1998 Masenas ............. H03M 7/3086
341/51
8,774,143 B2 7/2014 Ansari et al.
(Continued)

FOREIGN PATENT DOCUMENTS

JP 2012-120426 6/2012
JP 2015-135602 7/2015

*Primary Examiner* — Linh V Nguyen
(74) *Attorney, Agent, or Firm* — IPUSA, PLLC

(57) ABSTRACT

A data compression method includes inputting a data sequence that includes first data strings and second data strings alternating with each other, each of the first data strings containing one or more first data all of which have a same predetermined value, each of the second data strings containing one or more second data different from the predetermined value, determining first numbers and second numbers from a beginning of the input data sequence sequentially, each of the first numbers being a number of the first data in a respective one of the first data strings, and each of the second numbers being a number of the second data in a respective one of the second data strings, and arranging the first numbers, the second numbers, and the second data strings in a cyclic manner to generate compressed data.

19 Claims, 23 Drawing Sheets

(58) Field of Classification Search
CPC ...... G06F 3/0673; G06F 30/30; G06F 9/3001; G06F 9/30149
USPC .............................................. 341/65, 59, 60
See application file for complete search history.

(56) References Cited

U.S. PATENT DOCUMENTS

| | | | |
|---|---|---|---|
| 10,305,511 B1* | 5/2019 | Schultz | H03M 7/46 |
| 2006/0139188 A1* | 6/2006 | Sasakura | H03M 7/3084 |
| | | | 341/51 |
| 2015/0333766 A1* | 11/2015 | Nasser | G01C 21/20 |
| | | | 341/59 |
| 2018/0300606 A1* | 10/2018 | Corkery | G06F 9/3857 |
| 2020/0228136 A1* | 7/2020 | Huang | G06F 13/4027 |
| 2020/0228137 A1* | 7/2020 | Chinya | G06N 3/063 |
| 2021/0027148 A1* | 1/2021 | Meng | G06N 3/0481 |
| 2021/0351789 A1* | 11/2021 | Verrilli | H03M 7/707 |
| 2021/0351790 A1* | 11/2021 | Guilford | H03M 7/30 |

* cited by examiner

FIG.6

64-BYTE DIFFERENTIAL DATA SEQUENCE

```
00 00 00 00 00 00 00 00
00 00 00 00 00 00 00 00
00 00 00 [14] 00 00 00 00
00 00 00 00 00 00 [FF] 00
00 00 00 00 00 00 00 00
00 00 00 00 00 00 00 00
00 00 00 00 00 00 00 00
00 00 00 00 00 00 00 [03]
```

[ ] : NON-ZERO VALUE

COMPRESSION ↓↑ DECOMPRESSION

`14 01 14 1A 02 FF 03 0F` ⇒ COMPRESSION RATIO =0.125 (=8/64)

- 1Ah ZERO VALUES ("00h")
- 01h NON-ZERO VALUE ("14h")
- 14h ZERO VALUES ("00h")
- 02h NON-ZERO VALUES ("FFh" AND "03h")
- 0Fh ZERO VALUES ("00h")

COMPARATIVE EXAMPLE (TYPICAL RUN LENGTH ENCODING)

`00 14 14 01 00 1A FF 01 03 01 00 0F` ⇒ COMPRESSION RATIO =0.1875 (=12/64)

- 14h "00h" VALUES
- 01h "14h" VALUE
- 1Ah "00h" VALUES
- 01h "FFh" VALUE
- 01h "03h" VALUE
- 0Fh "00h" VALUES

| CONSECUTIVE NUMBER m | TIMES OF APPEARANCES | v(0) [2 BITS] | v(1) [4 BITS] | v(0) or v(0)+v(1)*r(0) | CODE VALUE OF CONSECUTIVE NUMBER STORED IN BODY |
|---|---|---|---|---|---|
| 0 | 0 | 0 | — | 0 | 00 b |
| 1 | 445 | 1 | — | 1 | 01 b |
| 2 | 335 | 2 | — | 2 | 10 b |
| 3 | 49 | 3 | 0 | 3 + 0*1 | 11 0000 b |
| 4 | 8 | 3 | 1 | 3 + 1*1 | 11 0001 b |
| 5 | 3 | 3 | 2 | 3 + 2*1 | 11 0010 b |
| 6 | 2 | 3 | 3 | 3 + 3*1 | 11 0011 b |
| 7 | 4 | 3 | 4 | 3 + 4*1 | 11 0100 b |
| 8 | 7 | 3 | 5 | 3 + 5*1 | 11 0101 b |
| 9 | 0 | 3 | 6 | 3 + 6*1 | 11 0110 b |
| 10 | 4 | 3 | 7 | 3 + 7*1 | 11 0111 b |
| 11 | 1 | 3 | 8 | 3 + 8*1 | 11 1000 b |
| 12 | 1 | 3 | 9 | 3 + 9*1 | 11 1001 b |
| AVERAGE NUMBER OF BITS | | | | 2.37 | |

ZEROTH DIVISION GROUP: m = 0–3
FIRST DIVISION GROUP: m = 4–12

FIG.20

| | | | | | | $P=3, t(0)=2, t(1)=1, r(0)=2, r(1)=1$ | |
|---|---|---|---|---|---|---|---|
| CONSECUTIVE NUMBER m | TIMES OF APPEARANCES | v(0) [2 BITS] | v(1) [1 BIT] | v(2) [3 BITS] | | v(0) or v(0)+v(1)\*r(0) or v(0)+v(1)\*r(0) +v(2)\*r(0)\*r(1) | CODE VALUE OF CONSECUTIVE NUMBER STORED IN BODY |
| 0 | 0 | 0 | — | — | ZEROTH DIVISION GROUP | 0 | 00 b |
| 1 | 445 | 1 | — | — | | 1 | 01 b |
| 2 | 335 | 2 | 0 | — | FIRST DIVISION GROUP | 2 + 0\*2 | 10 0 b |
| 3 | 49 | 3 | 0 | — | | 3 + 0\*2 | 11 0 b |
| 4 | 8 | 2 | 1 | 0 | SECOND DIVISION GROUP | 2 + 1\*2 + 0\*2\*1 | 10 1 000 b |
| 5 | 3 | 3 | 1 | 0 | | 3 + 1\*2 + 0\*2\*1 | 11 1 000 b |
| 6 | 2 | 2 | 1 | 1 | | 2 + 1\*2 + 1\*2\*1 | 10 1 001 b |
| 7 | 4 | 3 | 1 | 1 | | 3 + 1\*2 + 1\*2\*1 | 11 1 001 b |
| 8 | 7 | 2 | 1 | 2 | | 2 + 1\*2 + 2\*2\*1 | 10 1 010 b |
| 9 | 0 | 3 | 1 | 2 | | 3 + 1\*2 + 2\*2\*1 | 11 1 010 b |
| 10 | 4 | 2 | 1 | 3 | | 2 + 1\*2 + 3\*2\*1 | 10 1 011 b |
| 11 | 1 | 3 | 1 | 3 | | 3 + 1\*2 + 3\*2\*1 | 11 1 011 b |
| 12 | 1 | 2 | 1 | 4 | | 2 + 1\*2 + 4\*2\*1 | 11 1 100 b |
| AVERAGE NUMBER OF BITS | | | | | | | 2.59 |

FIG.21

| DESCRIPTION OF SIGN | | |
|---|---|---|
| SIGN | CONTENT | VALUE |
| M | MAXIMUM VALUE OF CONSECUTIVE NUMBER | |
| m | CONSECUTIVE NUMBER | $1 \sim M$ |
| P | DIVISION NUMBER | |
| p | DIVISION GROUP NUMBER | $0 \sim P-1$ |
| t(p) | Pth THRESHOLD | $0 \sim t(p)-1$ |
| v(p) | Pth DATA VALUE | |
| r(p) | Pth COEFFICIENT | $2^{\wedge}\text{CEIL}(\log_2(t(p)+1))-t(p)$ (DIFFERENCE BETWEEN SMALLEST VALUE AND THRESHOLD VALUE) |

| CONSECUTIVE NUMBER m (DEFINITION OF MATHEMATICAL EXPRESSION) | | |
|---|---|---|
| DIVISION GROUP | MATHEMATICAL EXPRESSION FOR DETERMINING CONSECUTIVE NUMBER m | CONSECUTIVE NUMBER m |
| ZEROTH | v(0) | $0 \sim t(0)-1$ |
| FIRST | $v(0)+v(1) \times r(0)$ | $t(0) \sim t(0)+t(1) \times r(0)-1$ |
| SECOND | $v(0)+v(1) \times r(0)+v(2) \times r(0) \times r(1)$ | $t(0)+t(1) \times r(0) \sim t(0)+t(1) \times r(0)+t(2) \times r(0) \times r(1)-1$ |
| ⋮ | ⋮ | ⋮ |
| (P-1)th | $\Sigma \{p=0 \sim P-1\} v(p) \times \Pi \{i=0 \sim p-1\} r(i)$ | $\Sigma \{p=0 \sim P-2\} t(p) \times \Pi \{i=0 \sim p-1\} r(i) \sim$ |

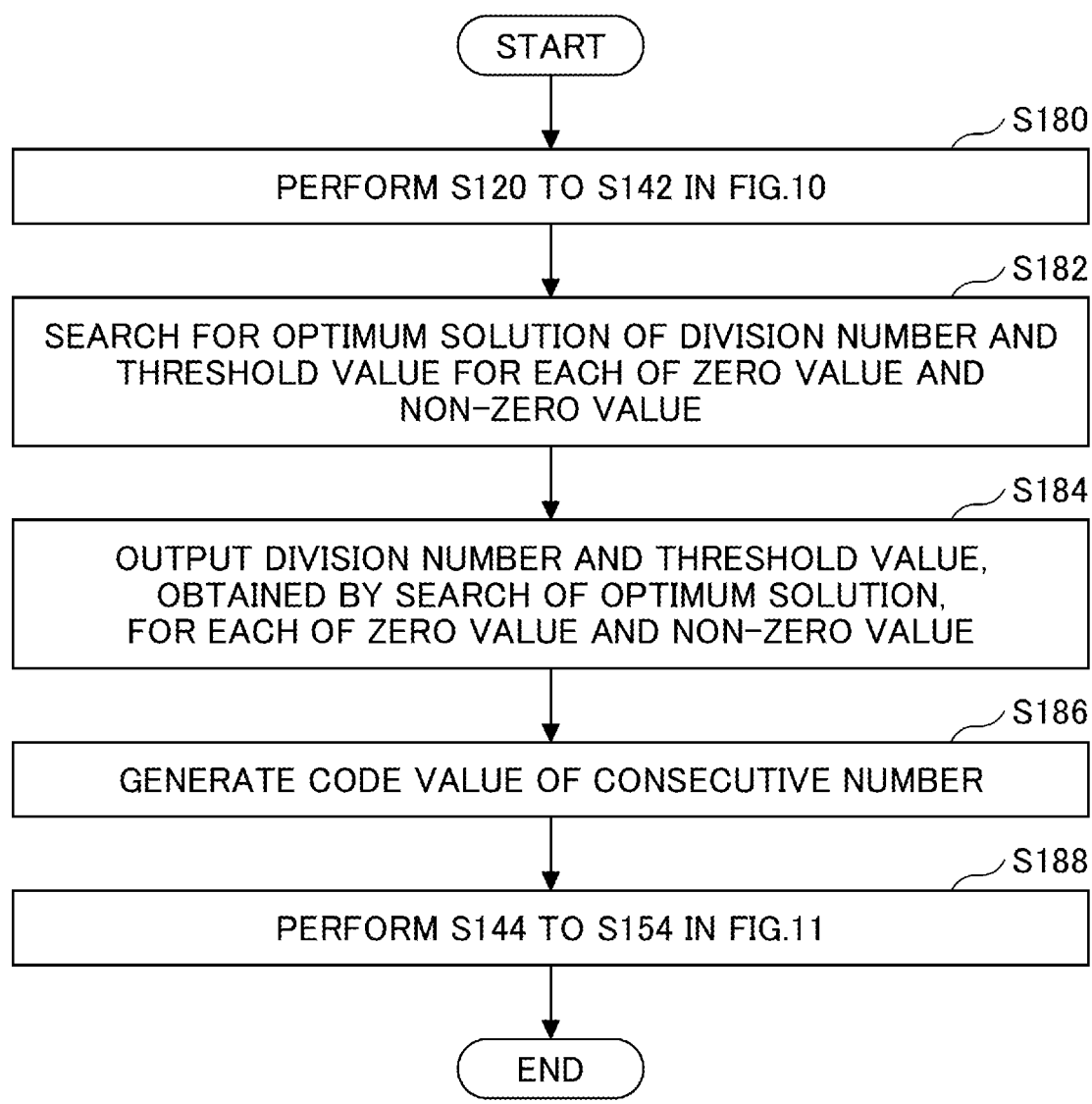

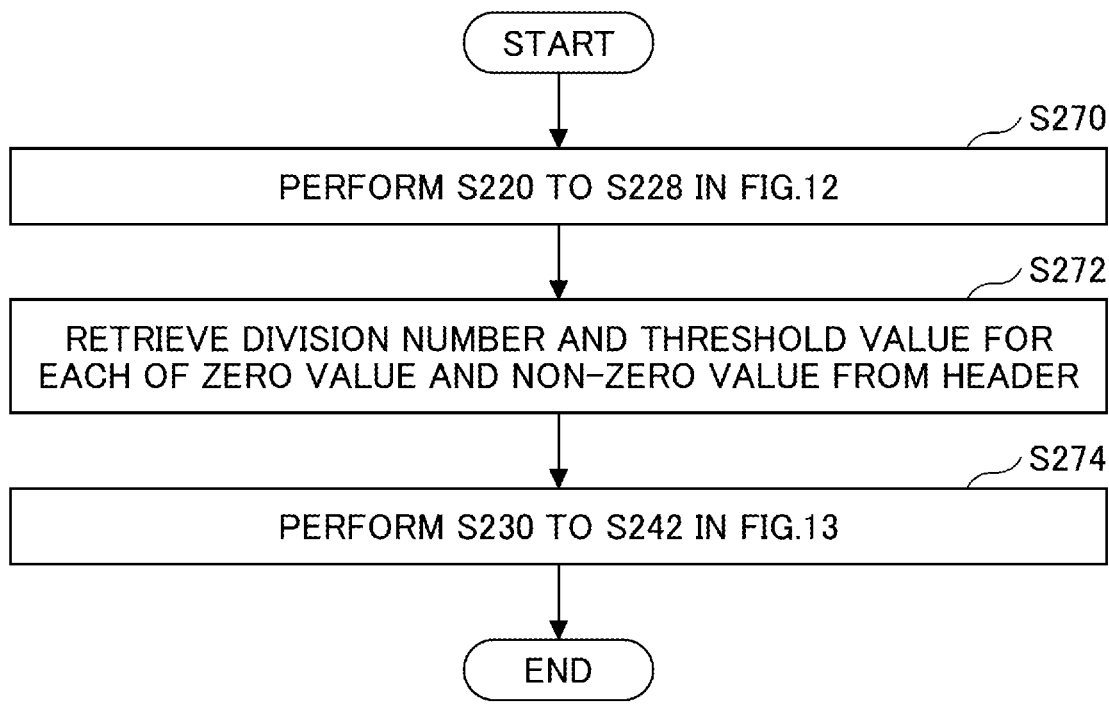

DATA COMPRESSION METHOD, DATA COMPRESSION DEVICE, DATA DECOMPRESSION METHOD, AND DATA DECOMPRESSION DEVICE

CROSS-REFERENCE TO RELATED APPLICATION

This application is based upon and claims priority to Japanese Patent Application No. 2020-155010, filed on Sep. 15, 2020, the entire contents of which are incorporated herein by reference.

BACKGROUND OF THE INVENTION

1. Field of the Invention

The present disclosure relates to a data compression method, a data compression device, a data decompression method, a data decompression device, a non-transitory computer-readable recording medium having stored a data compression program, and a non-transitory computer-readable recording medium having stored a data decompression program.

2. Description of the Related Art

In recent years, various embedded devices have been connected to a network by using the Internet of Things (IoT) technology. Such embedded devices have, for example, a function of updating firmware through a network (see, for example, Patent Document 1).

Additionally, as a method of controlling against an increase in traffic required to update firmware through a network, a method of distributing differential data of firmware between firmware to be updated and updated firmware is known. As a typical method for extracting differential data of binary data, diff, bsdiff, and the like are known (see, for example, Patent Document 2).

As described above, if differential data of firmware between firmware to be updated and updated firmware is distributed through a network, compression of the differential data can further suppress an increase in traffic. However, embedded devices such as smart meters connected to a network are equipped with only small-scale computers such as a micro control unit (MCU) and relatively small-capacity memories, which have poor computing resources. Therefore, it is difficult to apply a sophisticated compression algorithm, such as bzip2 and the Lempel-Ziv-Markov chain algorithm (LZMA), which are used in information devices such as servers having high processing performance and high memory capacity, to embedded devices.

With respect to the above, run-length encoding is known as a compression algorithm that performs compression by using a relatively simple method and that performs expansion (i.e., decompression) with a small capacity work memory. However, the compression efficiency of run-length encoding is lower than that of bzip2 and LZMA. Therefore, when firmware update data is delivered to embedded devices connected to a network by using run-length encoding, or the like, the amount of traffic in the network may increase.

In view of the above problem, it is desirable to reduce the amount of traffic to deliver compressed data by improving the compression efficiency of data sequences by using a simple compression method.

RELATED-ART DOCUMENTS

Patent Document

[Patent Document 1] Japanese Patent Application Laid-Open No. 2012-120426
[Patent Document 2] Japanese Patent Application Laid-Open No. 2015-135602

SUMMARY OF THE INVENTION

According to one aspect of an embodiment, a data compression method includes inputting a data sequence that includes first data strings and second data strings alternating with each other, each of the first data strings containing one or more first data all of which have a same predetermined value, each of the second data strings containing one or more second data which are different from the predetermined value, determining first numbers and second numbers from a beginning of the input data sequence sequentially, each of the first numbers being a number of the first data in a respective one of the first data strings, and each of the second numbers being a number of the second data in a respective one of the second data strings, and arranging the first numbers, the second numbers, and the second data strings in a cyclic manner to generate compressed data such that each cycle includes one of the first numbers, one of the second numbers, and one of the second data strings containing one or more second data that are equal in number to the one of the second numbers.

According to at least one embodiment, by improving the compression efficiency of data sequences by using a simple compression method, the amount of traffic to deliver compressed data can be reduced.

BRIEF DESCRIPTION OF THE DRAWINGS

FIG. 6 is an explanatory drawing illustrating an example of a compression process performed by the data distribution device and a decompression process performed by the device in the data distribution system of FIG. 1.

FIG. 19 is an explanatory drawing illustrating an example of code values corresponding to a number of the consecutive zero values and a number of the consecutive non-zero values stored in a body illustrated in FIG. 18;

FIG. 20 is an explanatory drawing illustrating another example of code values corresponding to a number of the consecutive zero values and a number of the consecutive non-zero values stored in the body illustrated in FIG. 18;

FIG. 21 is an explanatory drawing illustrating an example of a mathematical expression used when the decompression processing unit of the device extracts the number of consecutive values from the code value;

FIG. 22 is a flowchart illustrating an example of the compression process performed by a compression processing unit of the data distribution device according to the fourth embodiment; and FIG. 23 is a flowchart illustrating an example of the decompression process performed by a decompression processing unit of the device according to the fourth embodiment.

DETAILED DESCRIPTION OF THE EMBODIMENTS

In the following, embodiments will be described with reference to the drawings. In each of the drawings, the same components are referenced by the same reference sign and overlapping descriptions may be omitted.

First Embodiment

Figure 1:
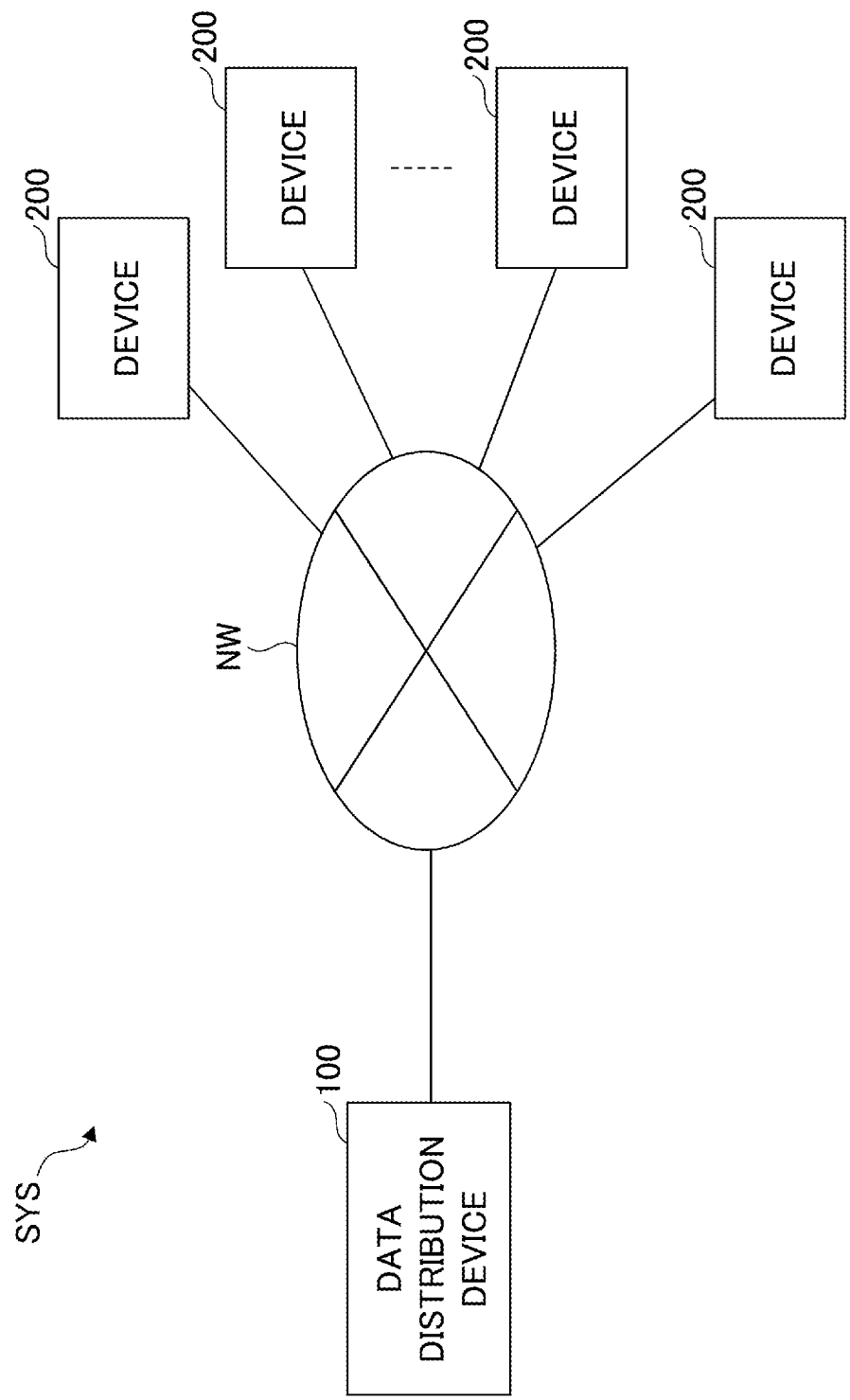
FIG. 1 is a block diagram illustrating an example of a data distribution system according to a first embodiment of the present disclosure.

FIG. 1 is a block diagram illustrating an example of a data distribution system according to a first embodiment of the present disclosure. The data distribution system SYS illustrated in FIG. 1 includes a data distribution device 100 and at least one device 200 connected to each other through a network NW. In the example illustrated in FIG. 1, a large number of devices 200 are connected to the network NW. The connection between the data distribution device 100 and the network NW and the connection between each of the devices 200 and the network NW may be wired or wireless.

For example, the data distribution device 100 is an information processing device, such as a general purpose server and a personal computer, and has a function of delivering firmware update data to each of the devices 200 through the network NW. At this time, the data distribution device 100 extracts differential data between old firmware and new firmware as a data sequence, compresses the extracted data sequence, and distributes the compressed data sequence to each of the devices 200. For example, each of the devices 200 is an information terminal such as a smart meter (i.e., an electricity meter) installed in a factory, a plant, a private house, or the like. Additionally, each of the devices 200 may be a smartphone, a digital home appliance, a car navigation terminal, or the like.

Figure 2:
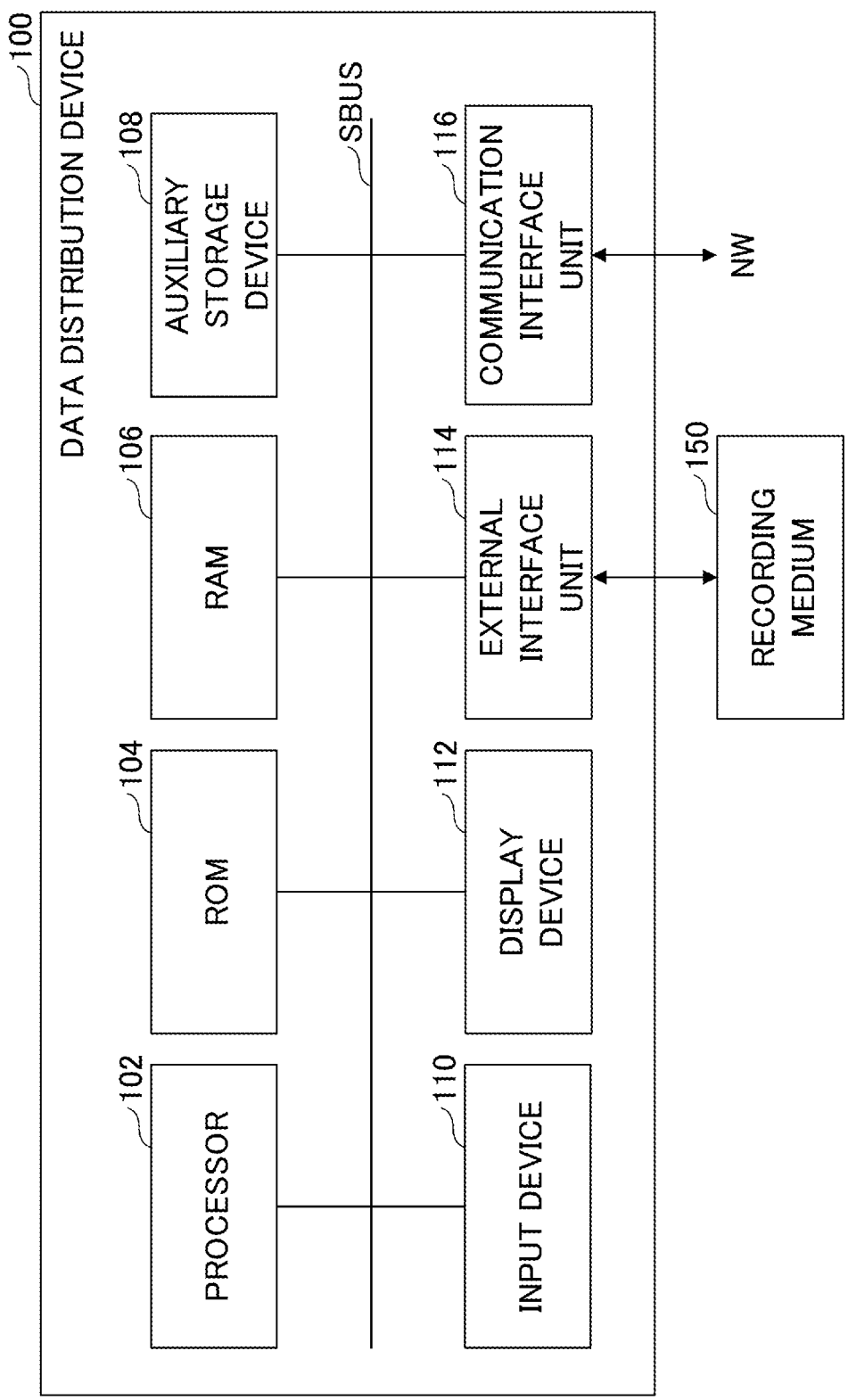
FIG. 2 is a block diagram illustrating an example of a hardware configuration of the data distribution device of FIG. 1.

FIG. 2 is a block diagram illustrating an example of a hardware configuration of the data distribution device 100 of FIG. 1. The data distribution device 100 includes a processor 102, a read only memory (ROM) 104, a random access memory (RAM) 106, and an auxiliary storage device 108, which are interconnected through a system bus SBUS. Additionally, the data distribution device 100 includes an input device 110, a display device 112, an external interface unit 114, and a communication interface unit 116. The processor 102 is an example of a computer.

The processor 102 is an arithmetic processing device such as a central processing unit (CPU). The processor 102 controls an entire operation of the data distribution device 100 and generates firmware update data (i.e., compressed data) to be delivered to each of the devices 200. For example, the processor 102 operates by executing a control program and a data compression program deployed from the ROM 104 or the auxiliary storage device 108 to the RAM 106.

The processor 102 executes the control program to control the entire operation of the data distribution device 100 and executes the data compression program to generate the firmware update data to be delivered to each of the devices 200. The generation of the firmware update data may be performed by a programmable logic such as a field-programmable gate array (FPGA) mounted on the processor 102. Alternatively, the generation of firmware update data may be performed by a programmable logic such as an FPGA connected to the system bus SBUS.

The ROM 104 may store not only various programs executed by the processor 102 but also various parameters used in the data distribution device 100. The RAM 106 may store work data used in the data distribution device 100. The auxiliary storage device 108 may be, for example, a hard disk drive (HDD) or a solid state drive (SSD), or the like.

The input device 110 may be, for example, at least one of a keyboard, a mouse, a touch panel, or the like. The display device 112 may be, for example, a liquid crystal display or the like. The external interface unit 114 has a function of reading and writing data to an external device such as a recording medium 150 or the like connected to an input/output port (which is not illustrated). The recording medium 150 is not particularly limited, but may be, for example, a flexible disk, a compact disc (CD), a digital versatile disk (DVD), a secure digital (SD) memory card, a universal serial bus (USB) memory, or the like.

The communication interface unit 116 is connected to the network NW and has a function of transmitting the firmware update data from the data distribution device 100 to each of the devices 200 illustrated in FIG. 1. The data distribution device 100 may include an output device such as a printer or an output interface connected to the printer. The hardware configuration of the data distribution device 100 illustrated in FIG. 2 is an example, and is not limited to the configuration of FIG. 2.

Figure 3:
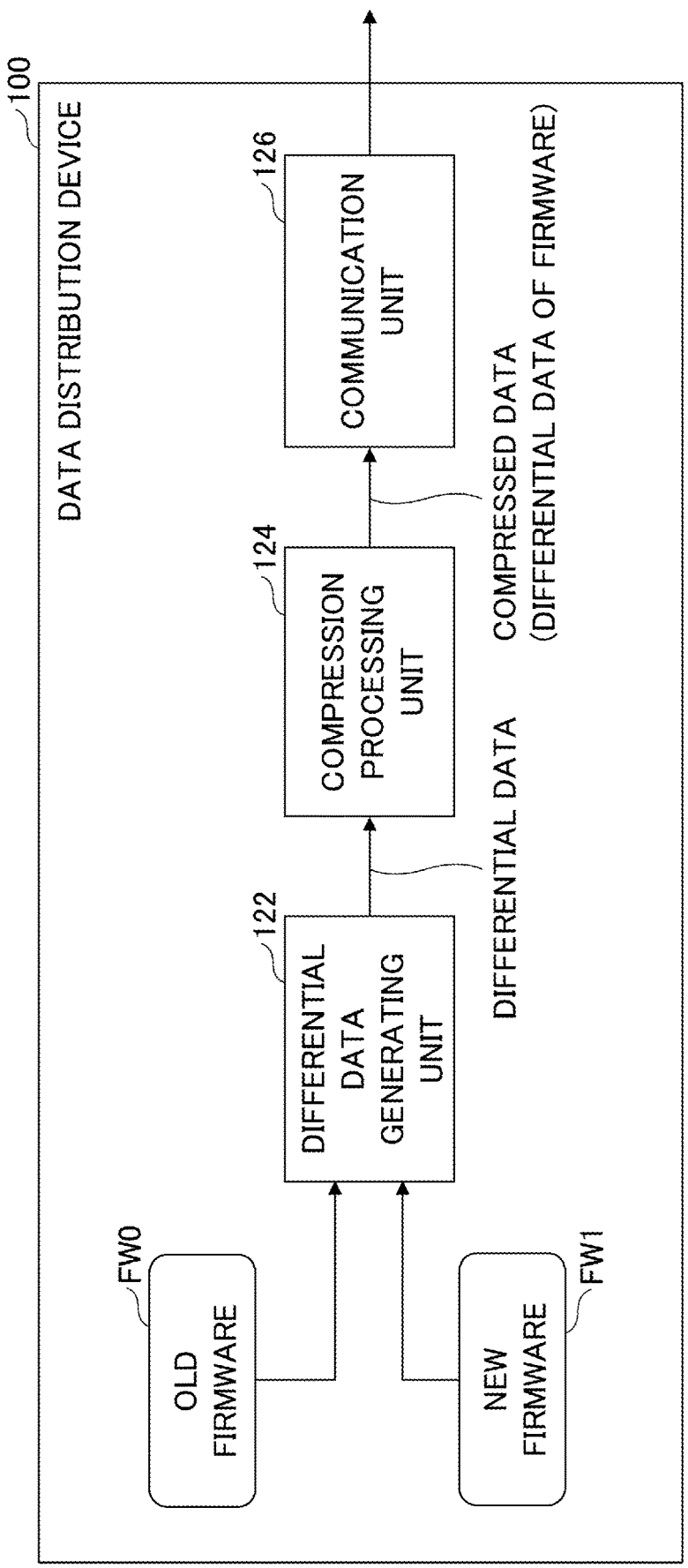
FIG. 3 is a block diagram illustrating an example of a functional configuration of the data delivery device of FIG. 1.

FIG. 3 is a block diagram illustrating an example of a functional configuration of the data distribution device 100 of FIG. 1. The data distribution device 100 includes a differential data generating unit 122, a compression processing unit 124, and a communication unit 126. The functional components illustrated in FIG. 3 may be implemented by hardware or may be implemented by executing software (i.e., a data compression program).

The differential data generating unit 122 compares binary data of old firmware FW0 and binary data of new firmware FW1 to create a differential data sequence representing the difference between the old firmware FW0 and the new firmware FW1. For example, the old firmware FW0 and the new firmware FW1 are stored in the RAM 106 or the auxiliary storage device 108 of FIG. 2.

The compression processing unit 124 generates compressed data by inputting the differential data sequence through an input unit (which is not illustrated) and compressing the input differential data sequence. The compression processing unit 124 is an example of a data compression device. The communication unit 126 corresponds to the communication interface unit 116 of FIG. 2 and transmits the compressed data to the device 200 required to update the firmware through the network NW.

Figure 4:
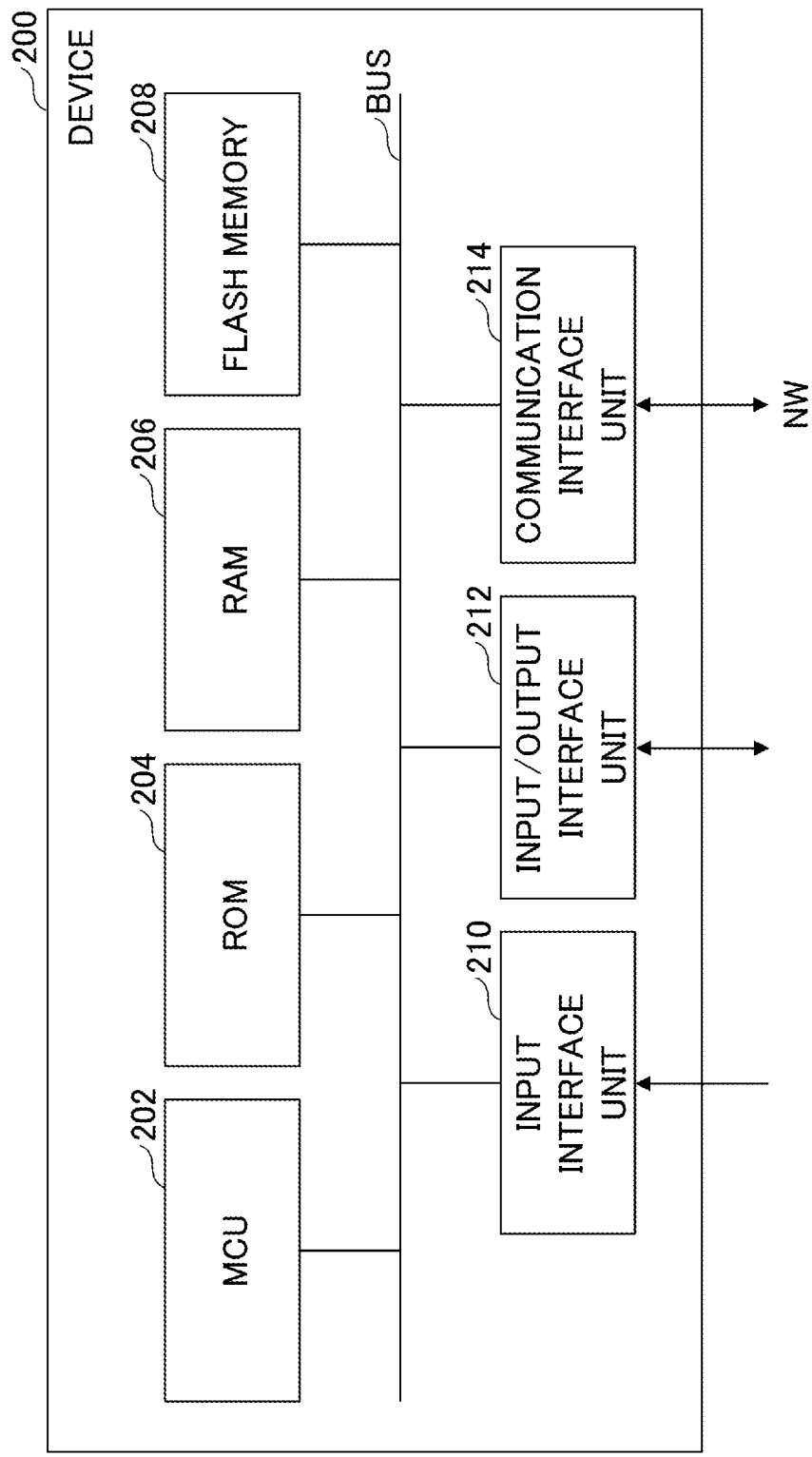
FIG. 4 is a block diagram illustrating an example of a hardware configuration of the device of FIG. 1.

FIG. 4 is a block diagram illustrating an example of a hardware configuration of the device 200 of FIG. 1. The device 200 includes a MCU 202, a ROM 204, a RAM 206, a flash memory 208, an input interface unit 210, an input/output interface unit 212, and a communication interface unit 214, which are interconnected with each other through a bus BUS. The MCU 202 is an example of a computer.

The MCU 202 includes a CPU core and various peripheral functions, and controls an entire operation of the device 200 by executing firmware. Additionally, the MCU 202 has a function of updating the firmware based on the firmware update data received from the data distribution device 100. For example, the firmware update is implemented by a data decompression program in a basic program executed by the MCU 202 at startup of the MCU 202 before starting to execute the firmware.

For example, the MCU 202 operates by executing the basic program stored in the ROM 204 and the firmware stored in the flash memory 208. The MCU 202 uses the compressed data (i.e., the differential data sequence of the firmware) received from the data distribution device 100 to update the firmware stored in the flash memory 208 by executing a data decompression program.

The ROM 204 may store not only the basic program executed by the MCU 202 but also various parameters used in the device 200. The RAM 206 may store work data used in the device 200.

The input interface unit 210, for example, receives electric energy information representing the amount of electric energy and outputs the received electric energy information to the MCU 202. Here, an analog signal representing the amount of electric energy may be supplied to an analog input terminal of the MCU 202 without using the input interface unit 210 and converted to a digital signal by an analog-to-digital converter (ADC) mounted on the MCU 202.

The input/output interface unit 212 is used to directly input and output various information to and from the device 200 installed in a factory, a plant, a private house, or the like. The communication interface unit 214 is connected to the network NW and has a function to receive the firmware update data or the like from the data distribution device 100. For example, the firmware update data is compressed data in which the differential data sequence between firmware to be updated and updated firmware is compressed. The firmware update data received by the communication interface unit 214 may be stored in the RAM 206 or the flash memory 208 and may be obtained by the MCU 202. The hardware configuration of the device 200 illustrated in FIG. 4 is an example and is not limited to the configuration illustrated in FIG. 4.

Figure 5:
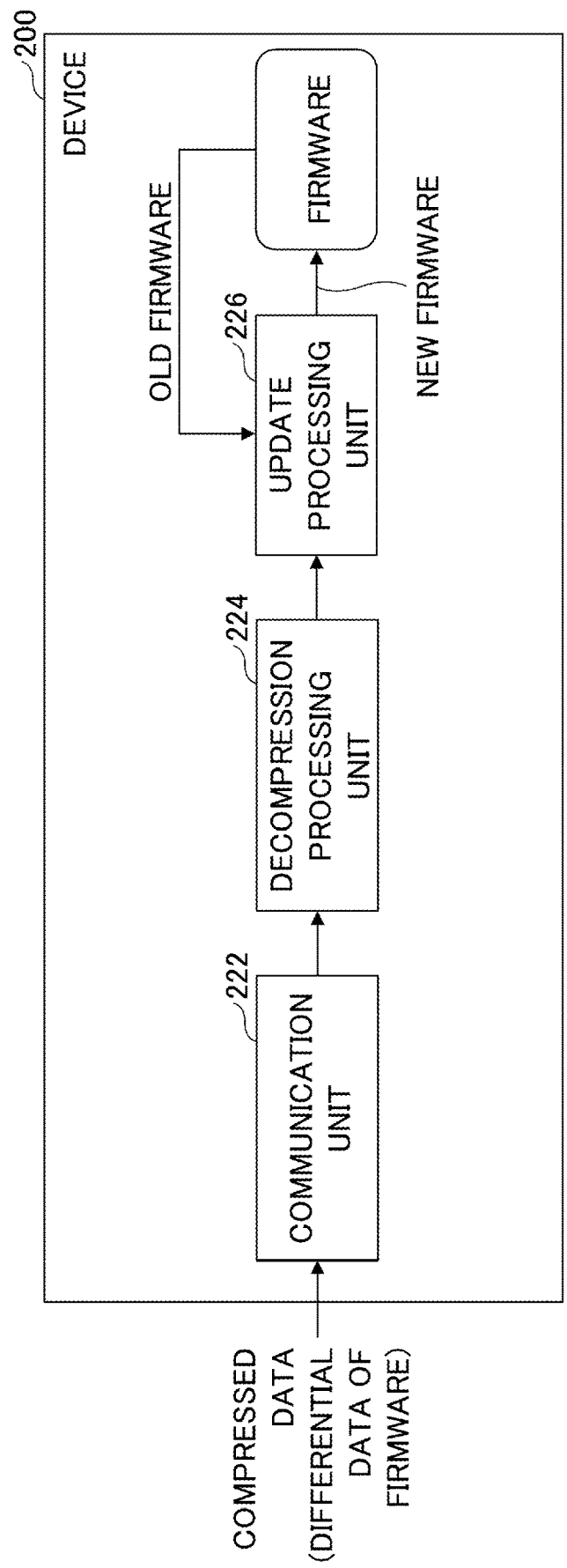
FIG. 5 is a block diagram illustrating an example of a functional configuration of the data device of FIG. 1.

FIG. 5 is a block diagram illustrating an example of a functional configuration of the device 200 of FIG. 1. The device 200 includes a communication unit 222, a decompression processing unit 224, and an update processing unit 226. The functional components illustrated in FIG. 5 may be implemented by hardware or may be implemented by executing software (i.e., a data compression program).

The communication unit 222 corresponds to the communication interface unit 214 illustrated in FIG. 4 and has a function of an input unit that inputs the compressed data (i.e., the differential data sequence of the firmware) received from the data distribution device 100 through the network NW. The communication unit 222 outputs the input compressed data to the decompression processing unit 224.

The decompression processing unit 224 decompresses the compressed data received from the communication unit 222 and generates the differential data sequence that is not compressed. The decompression processing unit 224 outputs the generated differential data sequence to the update processing unit 226. The decompression processing unit 224 is an example of a data decompression device.

The update processing unit 226 updates the firmware (i.e., the old firmware) stored in the flash memory 208 of FIG. 4 based on the differential data sequence received from the decompression processing unit 224 and stores the updated firmware as new firmware in the flash memory 208. The new firmware may be stored in the flash memory 208 after being stored in the RAM 206 of FIG. 4.

FIG. 6 is an explanatory drawing illustrating an example of a compression process performed by the data distribution device 100 and a decompression process performed by the device 200 in the data distribution system SYS of FIG. 1. A two-digit number illustrated in FIG. 6 is represented as a hexadecimal number. A sign "h" in the drawing indicates that the number is a hexadecimal number. FIG. 6 illustrates an example of compressing and decompressing a 64-byte differential data sequence in the firmware update data, for easier description, and assumes that the number of the consecutive zero values that is represented by 1 byte is up to 255. For example, the differential data generating unit 122 of FIG. 3 generates the differential data sequence by using a binary differential algorithm such as bsdiff.

In the 64-byte differential data sequences illustrated in FIG. 6, byte data represented by the rectangular frame of the dashed line represents a non-zero value indicating that the differential data is not "00h". The non-zero value indicates byte data where the old firmware to be updated differs from the new firmware that has been updated (i.e., an update). Byte data other than the byte data represented by the rectangular frame of the dashed line represents a zero value indicating that the differential data is "00h". The zero value indicates that the old firmware to be updated and the new firmware that has been updated have the same byte data (i.e., no update). The zero value is an example of a first data that is a predetermined value, and the non-zero value is an example of a second data that is other than the predetermined value. In the present embodiment and subsequent embodiments, the number of the consecutive zero values is an example of a first number, and the number of the consecutive non-zero values is an example of a second number.

As illustrated in FIG. 6, the firmware update data generally has few changes of the new firmware relative to the old firmware, and in the differential data sequence, the number of bytes indicating the zero value is greater than the number of bytes indicating the non-zero value. Thus, the compression processing unit 124 of FIG. 3 separates the differential data sequence generated by the differential data generating unit 122 into a data string having consecutive zero values and a data string having consecutive non-zero values, and compresses each data string.

First, the compression processing unit 124 generates "14h" as the compressed data because there are 20 bytes (14h bytes) of consecutive zero values in the differential data sequence. By generating the compressed data according to whether the differential data is the zero value or the non-zero value, the number of the consecutive zero values is only required to be arranged in the compressed data, and information indicating that a value is the zero value is not required.

Next, the compression processing unit 124 generates "01h 14h" as the compression data as indicated by the dashed frame, because there is one byte of non-zero value having a value of 14h in the differential data sequence. "01h" indicates that the number of the consecutive non-zero values is one (1 byte), and "14h" indicates 1 byte of the non-zero value itself. Next, the compression processing unit 124 generates "1Ah" as the compressed data because there are 26 bytes (1Ah bytes) of consecutive zero values in the differential data sequence.

Next, the compression processing unit 124 generates "02h FFh 03h" as the compression data, as indicated by the dashed frame, because there are 2 bytes of non-zero values that are FFh and 03h in the differential data sequence. "02h" indicates that the number of the consecutive non-zero values is two (2 bytes), and "FFh" and "03h" each indicate 1 byte of the non-zero value itself. Next, the compression processing unit 124 generates "0Fh" as the compressed data because there are 15 bytes (0Fh bytes) of consecutive zero values in the differential data sequence.

As a result of the above compression process, the 64-byte differential data sequence can be compressed to 8 bytes, and the compression ratio becomes "0.125". With respect to this, by using typical run length encoding, pairs of a "value" and "the number of the consecutive values" (which will be hereinafter referred to as a consecutive number) are generated in sequence. Thus, the generated compressed data includes "00h" indicating the zero value. Additionally, if the generated values are consecutive non-zero values that differ from each other (i.e., "FFh" and "03h"), the generated compressed data includes the consecutive number of the non-zero value, that is, "01h" for each of the consecutive non-zero values. Therefore, compression using typical run length encoding can only compress the 64-byte differential data sequence to 12 bytes, and the compression ratio becomes "0.1875".

That is, in the example illustrated in FIG. 6, the compressed data can be reduced to about 67% of the compressed data obtained by the compression using typical run length encoding, and the compression efficiency can be improved. As a result, the traffic amount of the network NW required when the firmware update data of the device 200 is delivered from the data distribution device 100 to each of the devices 200 can be reduced by about two-thirds in comparison with a case of compression using typical run length encoding.

The decompression of the compressed data is performed in the reverse order of the compression. For example, the differential data sequence that is an uncompressed data sequence can be decoded by repeating a process of decoding one or more zero values that are equal in number to a consecutive number indicating the number of the consecutive zero values and extracting one or more non-zero values that are equal in number to a consecutive number indicating the number of the consecutive non-zero values in the compressed data from the compressed data. As with the run length encoding, the decompression process can decompress the compressed data while sequentially reading the compressed data. Therefore, an increase of the amount of a work memory used when the MCU 202 performs the decompression process can be suppressed.

Figure 7:
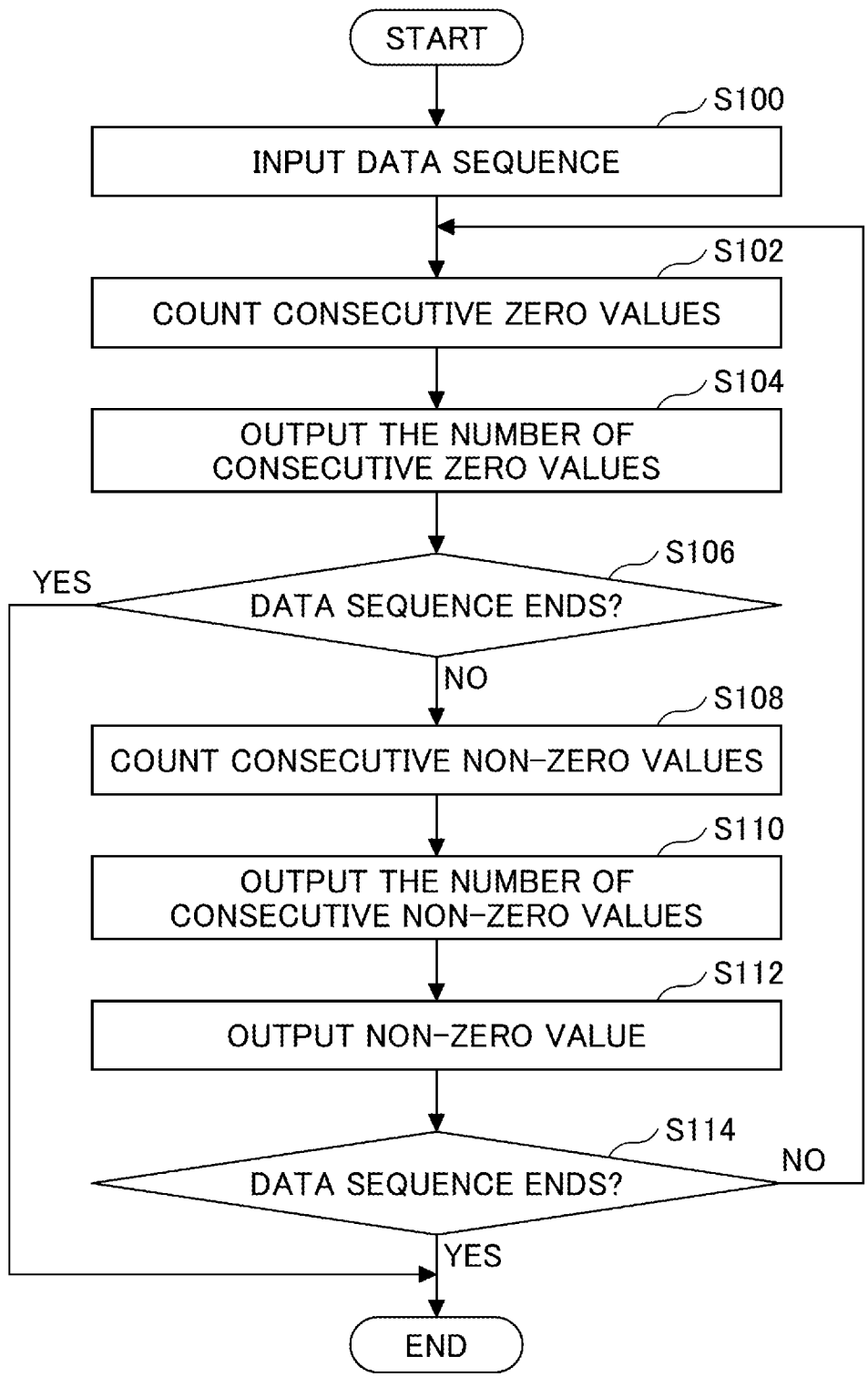
FIG. 7 is a flowchart illustrating an example of the compression process performed by a compression processing unit of the data distribution device of FIG. 3.

FIG. 7 is a flowchart illustrating an example of the compression process performed by the compression processing unit 124 of the data distribution device 100 of FIG. 3. That is, FIG. 7 illustrates an example of a data compression method performed by the data distribution device 100. For example, the process illustrated in FIG. 7 is achieved by the processor 102 of the data distribution device 100 executing the data compression program.

First, in step S100, the processor 102 inputs a data sequence that is update data (i.e., differential data) of the firmware from the differential data generating unit 122. Next, in step S102, the processor 102 counts consecutive zero values in the data sequence. Next, in step S104, the processor 102 outputs the number of the consecutive zero values counted in step S102 as one byte of the compressed data. If the number of the consecutive zero values is zero in step S102, that is, if a first value of the data sequence is a non-zero value, the processor 102 outputs zero "00h" as the number of the consecutive values.

Next, in step S106, if the data sequence ends, the processor 102 ends the process illustrated in FIG. 7, and if an uncompressed data sequence remains, the processor 102 performs step S108. In step S108, the processor 102 counts consecutive 1-byte non-zero values in the data sequence. Next, in step S110, the processor 102 outputs the number of the consecutive non-zero values obtained in step S108 as the compressed data. Next, in step S112, the processor 102 sequentially outputs one or more consecutive non-zero values that are equal in number to the count obtained in step S108. Next, in step S114, if the data sequence ends, the processor 102 ends the process illustrated in FIG. 7, and if an uncompressed data sequence remains, the processor 102 performs step S102.

Figure 8:
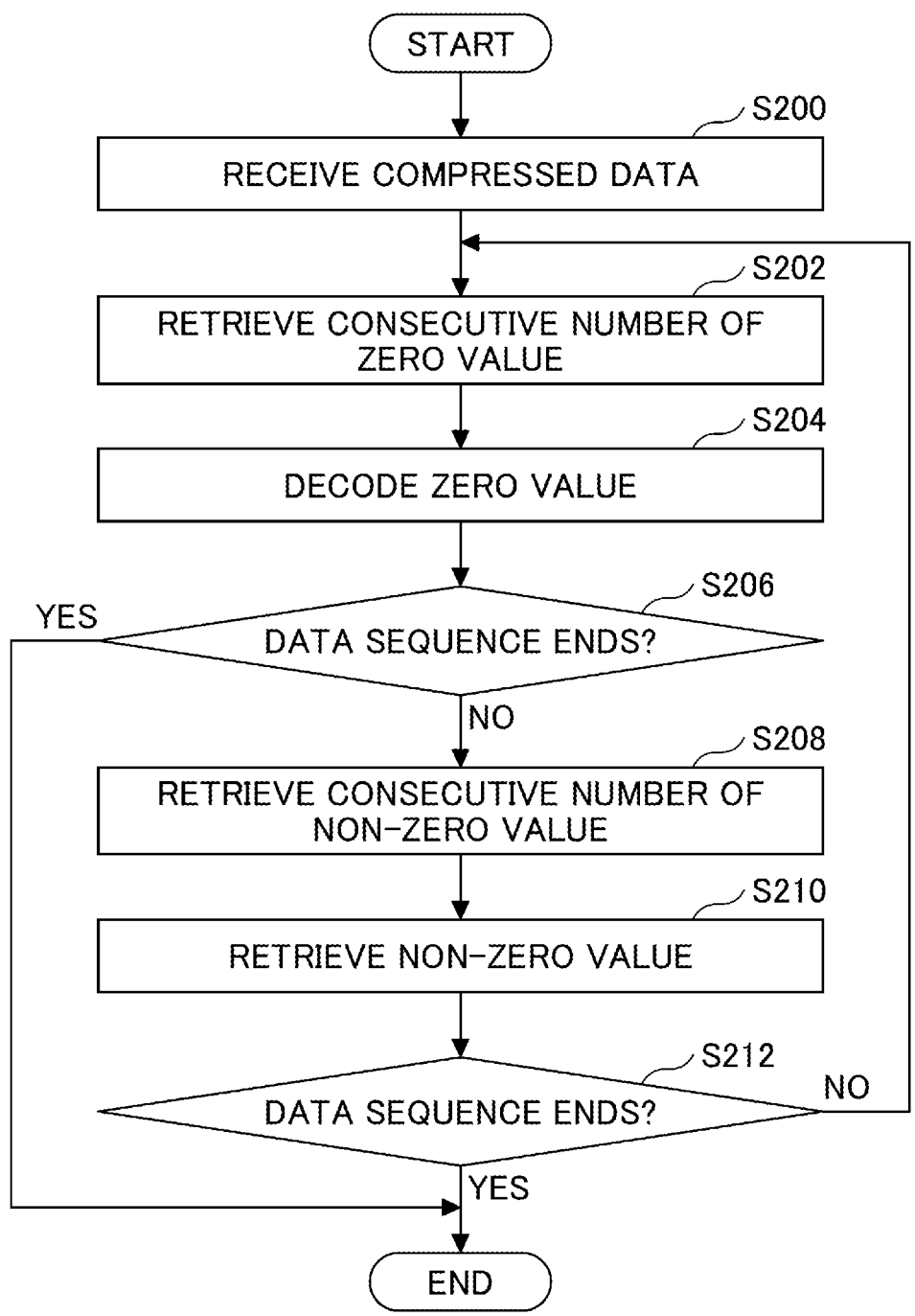
FIG. 8 is an explanatory drawing illustrating an example of the decompression process performed by a decompression processing unit of the device of FIG. 5.

FIG. 8 is an explanatory drawing illustrating an example of the decompression process performed by the decompression processing unit 224 of the device 200 of FIG. 5. That is, FIG. 8 illustrates an example of the data decompression method performed by the device 200. For example, the process illustrated in FIG. 8 is achieved by the MCU 202 of the data distribution device 100 executing the data decompression program.

First, in step S200, the MCU 202 receives (or inputs) the compressed data (i.e., the data sequence) that is the update data (i.e., the differential data) of the firmware from the data distribution device 100 through the network NW. For example, the MCU 202 performs the processing from step S202 to step S210 while receiving the data sequence. However, if the memory capacity of the storage device such as the RAM 206 is large enough, the MCU 202 may perform the processing of step S202 and later after receiving the entire update data of the firmware in step S200.

Next, in step S202, the MCU 202 retrieves the consecutive number of the zero value (1 byte) from the received data sequence. Next, in step S204, the MCU 202 decodes one or more zero values that are equal in number to the consecutive number of the zero value retrieved in step S202. Here, in the leading data of the data sequence, if the consecutive number of the zero value retrieved in step S202 is "00h", the leading data of the data sequence is a non-zero value. In this case, the MCU 202 does not decode the zero value in step S204.

Next, in step S206, if the data sequence ends, the MCU 202 ends the process illustrated in FIG. 8, and if a data sequence that is not decompressed remains, the MCU 202 performs step S208. In step S208, the MCU 202 retrieves the consecutive number of the non-zero value (1 byte) from the data sequence. Next, in step S210, the MCU 202 retrieves one or more non-zero values that are equal in number to the consecutive number of the non-zero value retrieved in step S208 from the data sequence. Next, in step S212, if the data sequence ends, the MCU 202 ends the process illustrated in FIG. 8, and if a data sequence that is not decompressed remains, the MCU 202 performs step S202.

As described above, in the first embodiment, by generating the compressed data according to whether the differential data is a zero value or a non-zero value, only the number of the consecutive zero values may be arranged in the compressed data for the zero value, and information indicating that the value is a zero value can be removed. As a result, the compression efficiency of the differential data that is a data sequence can be improved, and the traffic amount required when delivering the compressed data can be reduced. Additionally, as with the run length encoding, because the compressed data can be decompressed while reading sequentially, an increase of the amount of the work memory used when the MCU 202 performs the decompression process can be suppressed.

Second Embodiment

Figure 9:
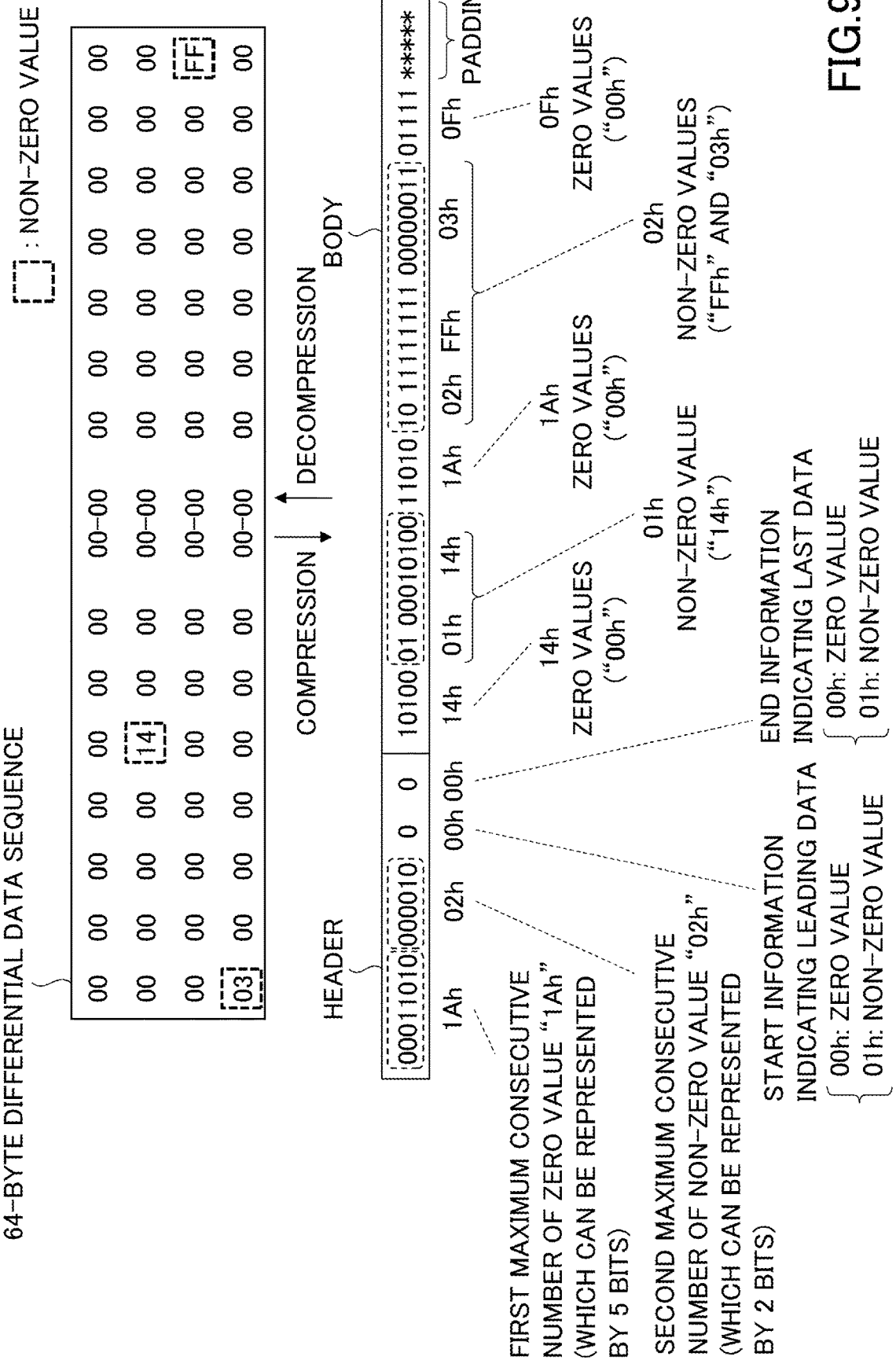
FIG. 9 is an explanatory drawing illustrating an example of a compression process performed by a data distribution device and a decompression process performed by a device in a data distribution system according to a second embodiment of the present disclosure.

FIG. 9 is an explanatory drawing illustrating an example of a compression process performed by a data distribution device and a decompression process performed by a device in a data distribution system according to a second embodiment of the present disclosure. For elements substantially the same as the elements in FIG. 6, the detailed description is omitted. In this embodiment, the size of the compressed data can be reduced by representing the consecutive numbers using a minimum number of bits that can represent the maximum value of the consecutive numbers that appear. Additionally, the maximum value of the consecutive numbers that can be represented is increased by adding information indicating whether the leading data is a zero value or a non-zero value to a header. Further, by adding information indicating whether the final data is a zero value or a non-zero value to the header, determining that padding appended to the end of the compressed data is the consecutive number of the zero value is avoided.

The configuration of the data distribution system SYS that performs the compression and decompression processes illustrated in FIG. 9 is substantially the same as the configuration illustrated in FIG. 1. That is, the data distribution device 100 is substantially the same as that of FIG. 2 and FIG. 3, except that the function of the compression processing unit 124 (FIG. 3) is different from that of the first embodiment. The device 200 is substantially the same as that of FIG. 4 and FIG. 5 except that the function of the decompression processing unit 224 (FIG. 5) is different from that of the first embodiment.

FIG. 9 also illustrates an example of compressing and decompressing a 64-byte differential data sequence in the firmware update data as in FIG. 6. In this embodiment, a header is arranged before a body that is the compressed data illustrated in FIG. 6. That is, the header is arranged before the first byte of the compressed data.

First, the compression processing unit 124 reads a differential data sequence (in this example, 64 bytes) used to generate the compressed data and calculates a first maximum consecutive number (or a first maximum number), which is the maximum value of the consecutive numbers of the zero value, and a second maximum consecutive number (or a second maximum number), which is the maximum value of the consecutive numbers of the non-zero value. In the example illustrated in FIG. 9, the first maximum number is "1Ah" and can be represented by 5 bits. The second maximum number is "02h" and can be represented in two bits. 5 bits are an example of a minimum first bit number that can represent the first maximum number of the consecutive numbers of the zero value, and 2 bits are an example of a minimum second bit number that can represent the second maximum number of the consecutive number of the non-zero value.

The compression processing unit 124 sequentially writes the first maximum number represented by a predetermined 8 bits and the second maximum number represented by a predetermined 6 bits to the header. The number of bits representing the first maximum number is not limited to 8 bits, but is determined in advance based on the maximum number of the consecutive numbers of the zero value included in the differential data sequence to be compressed. Similarly, the number of bits representing the second maximum number is not limited to 6 bits, but is determined in advance based on the maximum number of the consecutive numbers of the non-zero value included in the differential data sequence to be compressed.

Here, in the firmware update data, it is statistically known that the second maximum number of the differential data sequence is less than the first maximum number. Therefore, the size of the header can be reduced by reducing the number of bits of the second maximum number to be less than the number of bits of the first maximum number. In addition, the size of the header can be reduced by representing the second maximum number in bits instead of a byte.

The compression processing unit 124 arranges 1-bit start information indicating whether the first byte data of the differential data sequence is a zero value or a non-zero value after the second maximum number. For example, "0" in the start information indicates that the leading data is a zero value, and "1" in the start information indicates that the leading data is a non-zero value. By arranging the start information in the header, if the leading data is a non-zero value, the consecutive number of the non-zero value and one or more non-zero values that are equal in number to the consecutive number of the non-zero value can be arranged at the beginning of the body. That is, it is not necessary to set "0" at the beginning of the body as the consecutive number of the zero value.

Thus, if the number of the consecutive zero values is "1", "0" can be arranged in the body as the consecutive number of the zero value, and if the number of the consecutive zero values is "100h", "FF" can be arranged in the body as the consecutive number of the zero value. Therefore, the range of the consecutive number of the zero value arranged in the body can be increased in comparison with the first embodiment. Further, because the representation of the zero value and the representation of the non-zero value are normally common in the body, the range of the consecutive number of the non-zero value arranged in the body can be increased in comparison with the first embodiment.

In FIG. 9, the representation of the zero value and the representation of the non-zero value in the body is the same as the representation in the first embodiment in order to avoid complicated description. That is, for example, if the number of the consecutive zero values or the consecutive non-zero values is "1", "1" is placed as the consecutive number in the body.

Next, the compression processing unit 124 arranges 1-bit end information indicating whether the last 1-byte data of the differential data sequence is a zero value or a non-zero value after the start information. For example, "0" in the end information indicates that the last data is a zero value, and "1" in the end information indicates that the last data is a non-zero value.

If the body is represented in bits rather than bytes, padding that is not differential data may be added to the last byte of the body. Thus, if the last data of the differential data is a non-zero value and the padding is added, a mechanism, in which the decompression processing unit 224 (FIG. 5) does not determine that the padding is the consecutive number of the zero value, is required.

In this embodiment, if the end information of the header indicates that the last data is a non-zero value, the decompression processing unit 224 can read and discard the padding without determining that the padding is the consecutive number of the zero value. As a result, if the body is expressed in bits, the decompression process can be executed correctly and the firmware update process can be executed successfully.

After the header is generated, the compression processing unit 124 represents the consecutive number of the zero value by using 5 bits that can represent the first maximum number and represents the consecutive number of the non-zero value by using 2 bits that can represent the second maximum number in the body. The non-zero value itself arranged after the consecutive number of the non-zero value is represented by 1-byte, as in FIG. 6.

Thus, in this embodiment, the compression efficiency of the compressed data can be improved in comparison with FIG. 6 because the total number of consecutive bits of zero and non-zero values arranged in the body can be reduced, although the header is added. In particular, as the number of repeated zero values or non-zero values increases, the compression efficiency is improved. As a result, the traffic amount of the network NW required when the firmware update data of the device 200 is delivered from the data distribution device 100 to each of the devices 200 can be further reduced.

Figure 10:
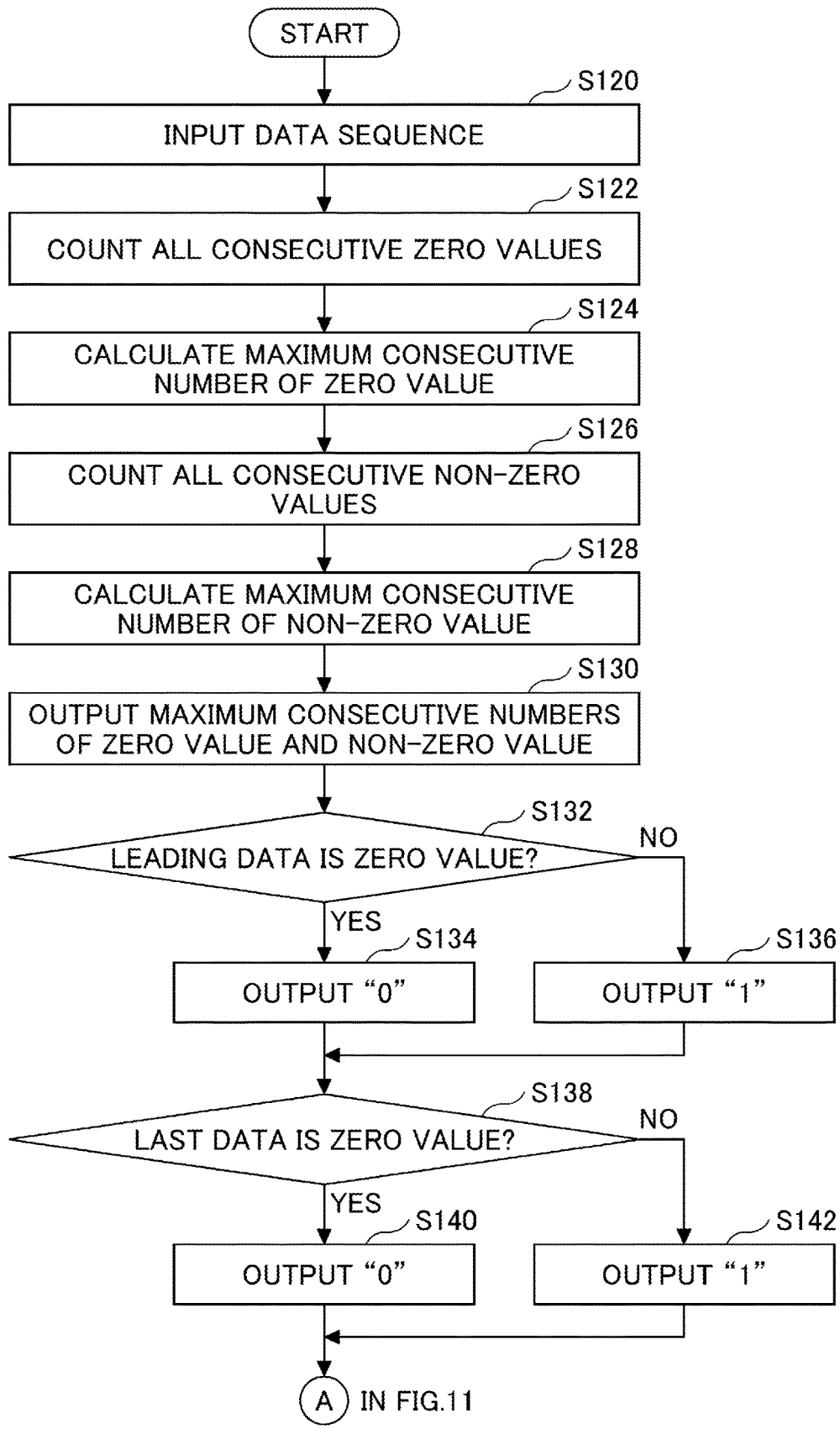
FIG. 10 is a flowchart illustrating an example of the compression process performed by a compression processing unit of the data distribution device according to the second embodiment.
Figure 11:
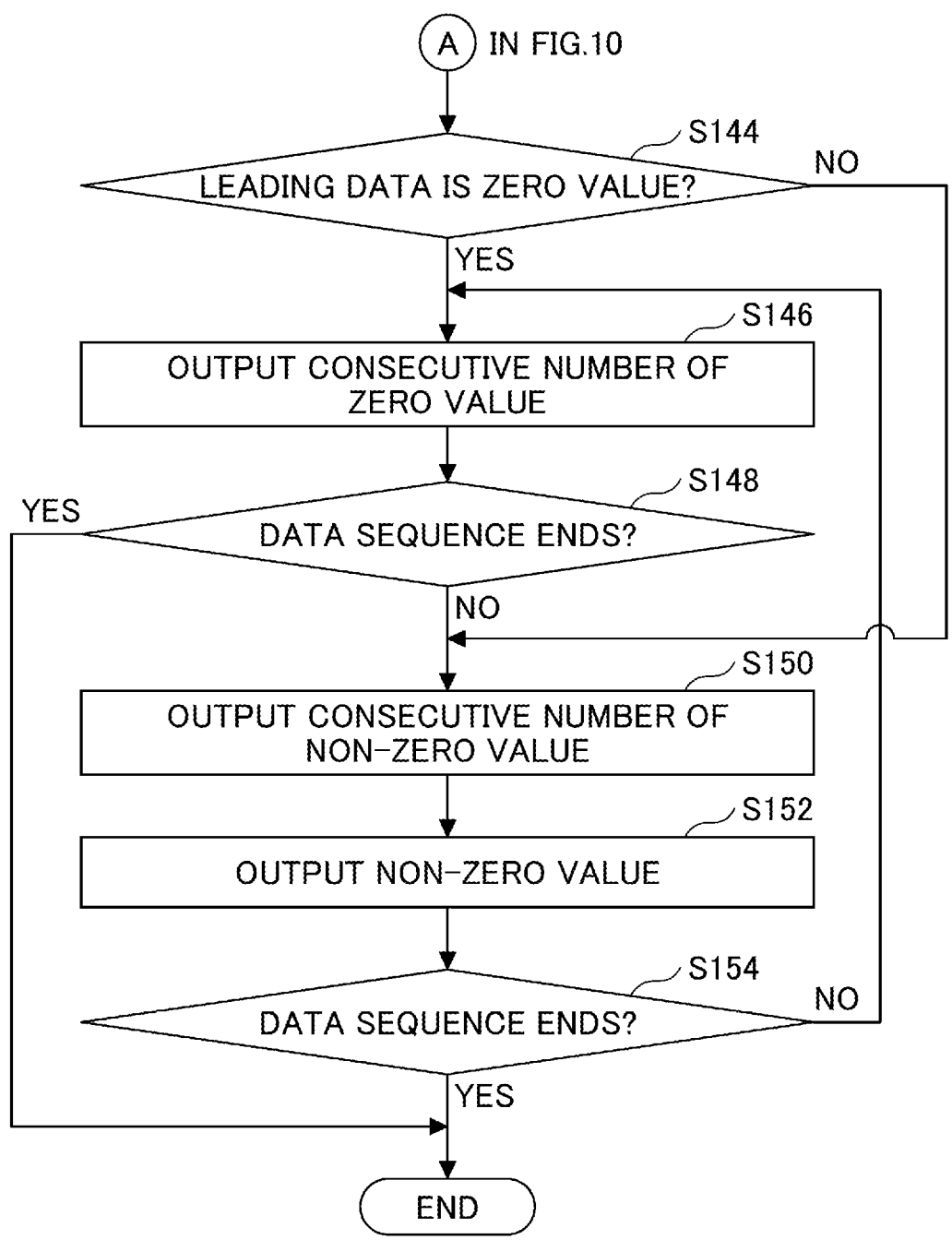
FIG. 11 is a flowchart illustrating a continuation of the compression process of FIG. 10.

FIG. 10 and FIG. 11 are a flowchart illustrating an example of the compression process performed by the compression processing unit 124 of the data distribution device 100 according to the second embodiment. That is, FIG. 10 and FIG. 11 illustrate an example of the data compression method performed by the data distribution device 100. For example, the process illustrated in FIG. 10 and FIG. 11 is achieved by the processor 102 of the data distribution device 100 executing the data compression program. For the same process as in FIG. 7, the detailed description is omitted.

First, in step S120, the processor 102 inputs the data sequence that is the update data (i.e., the differential data) of the firmware from the differential data generating unit 122. Next, in step S122, the processor 102 counts all consecutive zero values in the data sequence. Next, in step S124, the processor 102 calculates the maximum number that is the maximum value among all of the consecutive numbers of the zero value counted in step S122.

Next, in step S126, the processor 102 counts all consecutive non-zero values in the data sequence. Next, in step S128, the processor 102 calculates the maximum number that is the maximum value among all of the consecutive numbers of the non-zero value counted in step S126. Next, in step S130, the processor 102 outputs the maximum numbers of the zero and non-zero values calculated in steps S124 and S126 as the header.

Next, in step S132, if the leading data of the differential data sequence used to generate the compressed data is a zero value, the processor performs step S134, and if the leading data of the differential data sequence is a non-zero value, the processor performs step S136. In step S134, the processor 102 outputs 1 bit of "0" representing that the leading data is a zero value as the start information of the header and performs step S138. In step S136, the processor 102 outputs a 1 bit of "1" indicating that the leading data is a non-zero value as the start information of the header and performs step S138.

In step S138, if the last data of the differential data sequence used to generate the compressed data is a zero value, the processor 102 performs step S140, and if the last data of the differential data sequence is a non-zero value, the processor 102 performs step S142. In step S140, the processor 102 outputs 1 bit of "0" representing that the last data is a zero value as the end information of the header, and performs step S144 of FIG. 11. In step S142, the processor 102 outputs 1 bit of "1" indicating that the last data is a non-zero value as the end information of the header and performs step S144 of FIG. 11.

In step S144, if the leading data of the differential data sequence used to generate the compressed data is a zero value, the processor 102 performs step S146, and if the leading data of the differential data sequence is a non-zero value, the processor 102 performs step S150. In step S146, the processor 102 outputs the consecutive number of the zero value as the compressed data (i.e., the body). Next, in step S148, if the data sequence ends, the processor 102 ends the process illustrated in FIG. 10 and FIG. 11, and if an uncompressed data sequence remains, the processor 102 performs step S150.

In step S150, the processor 102 outputs the consecutive number of the non-zero value as the compressed data. Next, in step S152, the processor 102 sequentially outputs one or more non-zero values that are equal in number to the consecutive number of the non-zero value output in step S150. Next, in step S154, if the data sequence ends, the processor 102 ends the process illustrated in FIG. 10 and FIG. 11, and if an uncompressed data sequence remains, the processor 102 performs step S146. The processor 102 adds padding if the data sequence ends and if there are bits in the last byte of the body that do not define a value.

Figure 12:
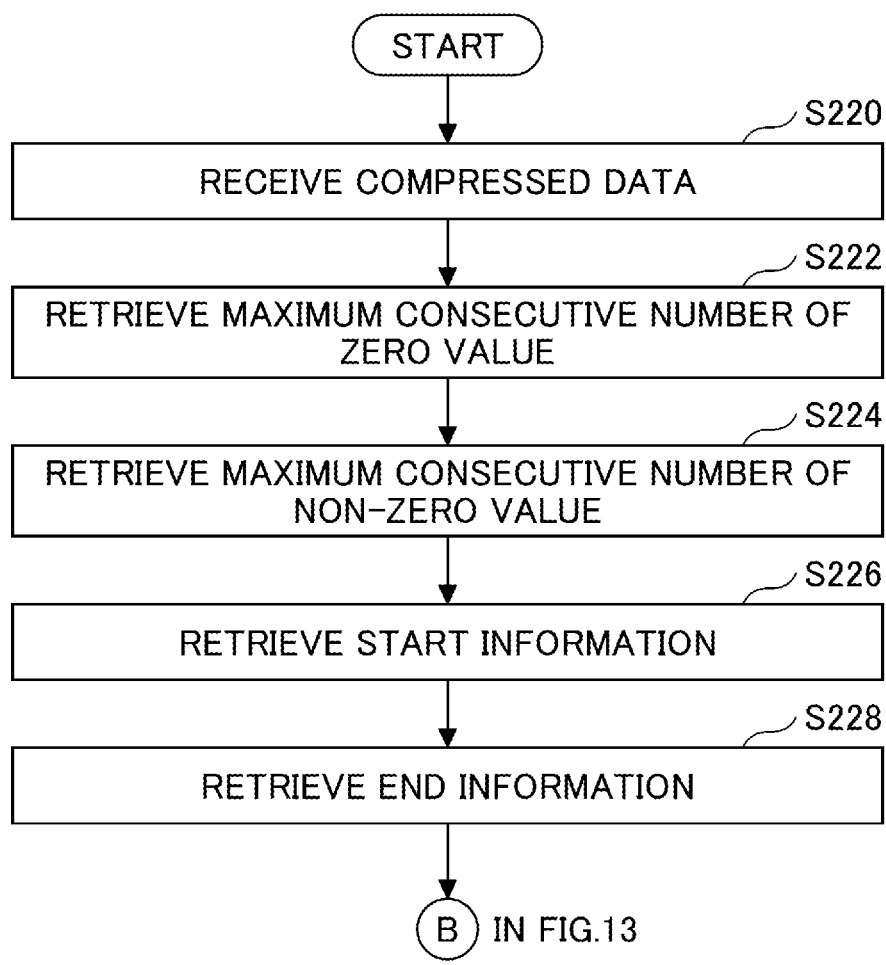
FIG. 12 is a flowchart illustrating an example of the decompression process performed by a decompression processing unit of the device according to the second embodiment.
Figure 13:
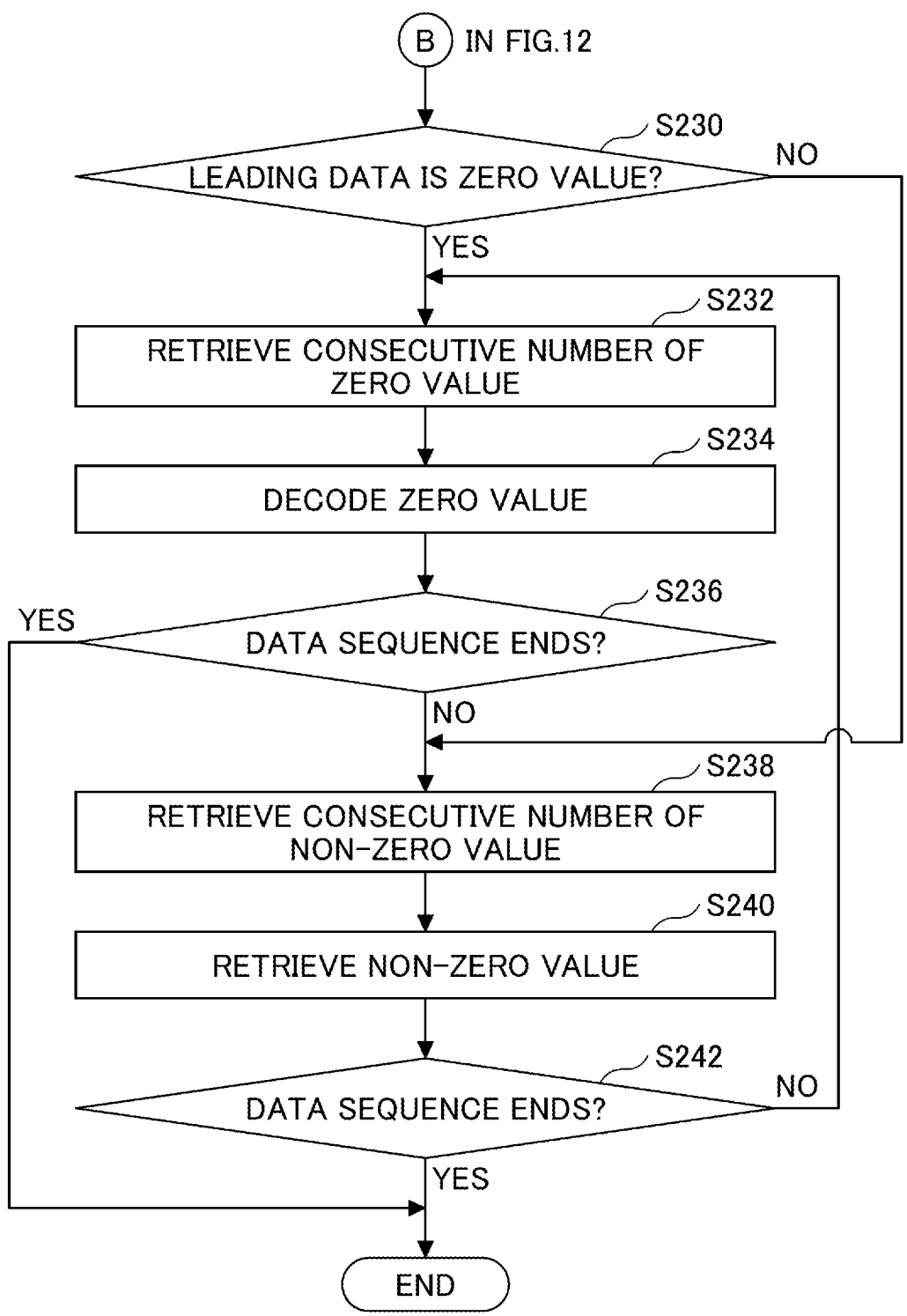
FIG. 13 is a flowchart illustrating a continuation of the decompression process of FIG. 12.

FIG. 12 and FIG. 13 are a flowchart illustrating an example of the decompression process performed by the decompression processing unit 224 of the device 200 according to the second embodiment. That is, FIG. 12 and FIG. 13 illustrate an example of the data decompression method performed by the device 200. For example, the process illustrated in FIG. 12 and FIG. 13 is achieved by the MCU 202 of the data distribution device 100 executing the data decompression program. For the same process as in FIG. 8, the detailed description is omitted.

First, in step S220, the MCU 202 receives the compressed data (i.e., the data sequence) that is the update data (i.e., the differential data) of the firmware from the data distribution device 100 through the network NW. That is, the MCU 202 inputs the header including the first maximum number of the zero value, the second maximum number of the non-zero value, the start information, and the end information, and the body including the consecutive numbers of the zero value, the consecutive numbers of the non-zero value, and the non-zero values.

For example, the MCU 202 may perform step S222 to step S228 after receiving the header from the data sequence and before receiving the body. Alternatively, the MCU 202 may start step S222 after receiving the header and the body from the data sequence.

In step S222, the MCU 202 retrieves the first maximum number of the zero value from the received header and calculates the number of bits that can represent the consecutive numbers of the zero value stored in the body. Next, in step S224, the MCU 202 retrieves the second maximum number of the non-zero value from the received header and calculates the number of bits that can represent the consecutive numbers of the non-zero value stored in the body. Next, in step S226, the MCU 202 retrieves the start information from the received header. Next, in step S228, the MCU 202 retrieves the end information from the received header.

Next, in step S230 of FIG. 13, based on the start information retrieved in step S226 of FIG. 12, the MCU 202 determines whether the leading data of the body of the received data sequence (i.e., the compressed data) is a zero value. If the leading data is a zero value, the MCU 202 performs step S232, and if the leading data is a non-zero value, the MCU 202 performs step S238. The processing in step S232 to step S242 is substantially the same as the processing in step S202 to step S212 in FIG. 8.

As described above, in the second embodiment, as in the first embodiment, only the consecutive number of the zero value may be arranged in the compressed data, and information indicating that the value is a zero value may be removed. Further, in the second embodiment, the total number of bits of the body can be reduced by reducing the numbers of bits representing the consecutive numbers of the zero value and the consecutive numbers of the non-zero value that are arranged in the body. Thus, the compression efficiency of the compressed data can be improved in comparison with the first embodiment. As a result, the traffic amount of the network NW required when the firmware update data of the device 200 is delivered from the data distribution device 100 to each of the devices 200 can be further reduced.

By arranging the start information in the header, it is not necessary to set "0" at the beginning of the body as the consecutive number of the zero value if the start data is a non-zero value. Therefore, the range of the consecutive number of the zero value arranged in the body can be increased in comparison with the first embodiment.

By arranging the end information in the header, the decompression processing unit 224 can read and discard the padding without determining that the padding is the consecutive number of the zero value if the end data is a non-zero value. As a result, if the body is represented in bits, the decompression process can be executed correctly and the firmware update process can be executed successfully.

Third Embodiment

Figure 14:
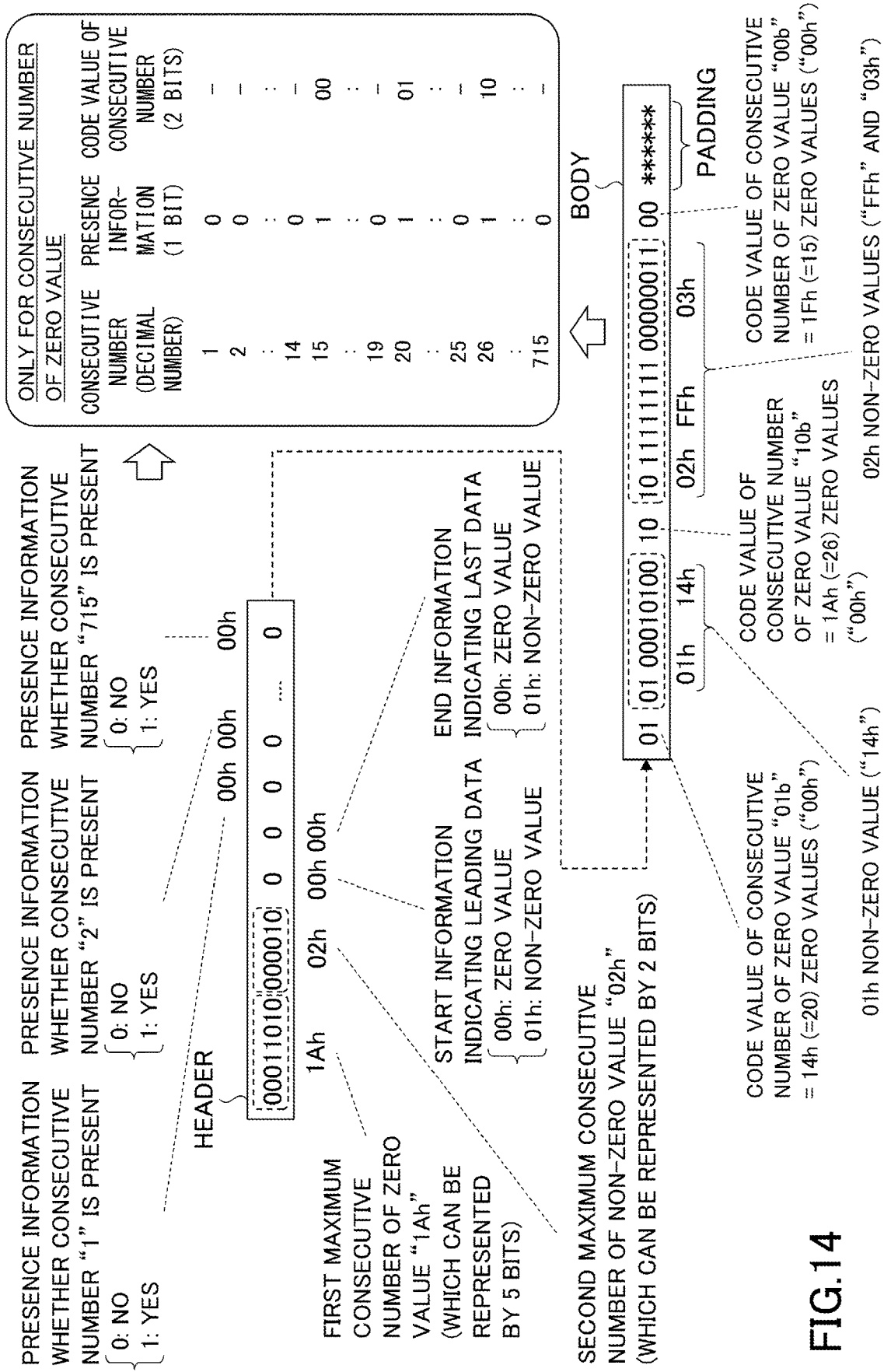
FIG. 14 is an explanatory drawing illustrating an example of a compression process performed by a data distribution device and a decompression process performed by a device in a data distribution system according to a third embodiment of the present disclosure.

FIG. 14 is an explanatory drawing illustrating an example of a compression process performed by a data distribution device and a decompression process performed by a device in a data distribution system according to a third embodiment of the present disclosure. For elements substantially the same as the elements in FIG. 6 and FIG. 9, the detailed description is omitted. In this embodiment, the size of the body is reduced by storing code values indicating the consecutive numbers that appear, instead of storing the consecutive numbers in the body of the compressed data.

The configuration of the data distribution system SYS that performs the compression process and decompression process illustrated in FIG. 14 is substantially the same as the compression process and decompression process illustrated in FIG. 1. That is, the data distribution device 100 is substantially the same as the data distribution device 100 in FIG. 2 and FIG. 3, except that the function of the compression processing unit 124 (FIG. 3) is different from that of the first embodiment. The device 200 is substantially the same as the device 200 in FIG. 4 and FIG. 5 except that the function of the decompression processing unit 224 (FIG. 5) is different from that of the first embodiment.

In this embodiment, as in FIG. 9, the header is arranged before the body, which is the compressed data. Although not illustrated, in the following, an example of compressing and decompressing the 64-byte differential data sequence illustrated in FIG. 6 in the firmware update data will be described.

The header includes presence information indicating whether a value of the consecutive number of the zero value appears for all values of the consecutive number of the zero value that can appear in the differential data sequence, in addition to the first maximum number, the second maximum number, the start information, and the end information illustrated in FIG. 9. The number of presence information is determined when the data distribution system is designed based on, for example, statistical information about the number of the consecutive zero values in the differential data sequence used to update firmware in the past. In the example illustrated in FIG. 14, 715 pieces of the presence information (1 bit each) respectively representing the presence or absence of the consecutive numbers 1 to 715 of the zero value that can appear are stored in the header.

The body is the same as the body of FIG. 9 except that the number of bits representing the consecutive number of the zero value is different from that of FIG. 9. The consecutive number of the zero value stored in the body is represented by a minimum number of bits that can represent the number of values of the consecutive number of the zero value that are actually present. That is, the consecutive number of the zero value stored in the body is represented by a minimum number of bits that can represent the total number of presence information that is set to "1" in the header.

In this embodiment, because the start information is included in the header, as in the second embodiment, each of the consecutive number of the zero value and the consecutive number of the non-zero value can represent the range from 1 to 256 using 1-byte of the body. However, in order to avoid the complicated description in FIG. 14, the representation of the zero value and the representation of the non-zero value in the body is the same as that of the first embodiment. That is, for example, if the number of consecutive zero values or the number of consecutive non-zero is "1", the consecutive number "1" is arranged in the body.

In the example illustrated in FIG. 14, because the values of the consecutive number of the zero value that appear are three values of "14h", "1Ah", and "0Fh", code values representing the consecutive numbers of the zero value stored in the body are represented by two bits. The code values stored in the body are assigned in ascending order of the consecutive number. In FIG. 14, two-bit code values "00", "01", and "10" are respectively assigned to the consecutive numbers "0Fh", "14h", and "1Ah". The code value is an example of a serial number indicating the consecutive number of the zero value included in the compressed data.

Figure 15:
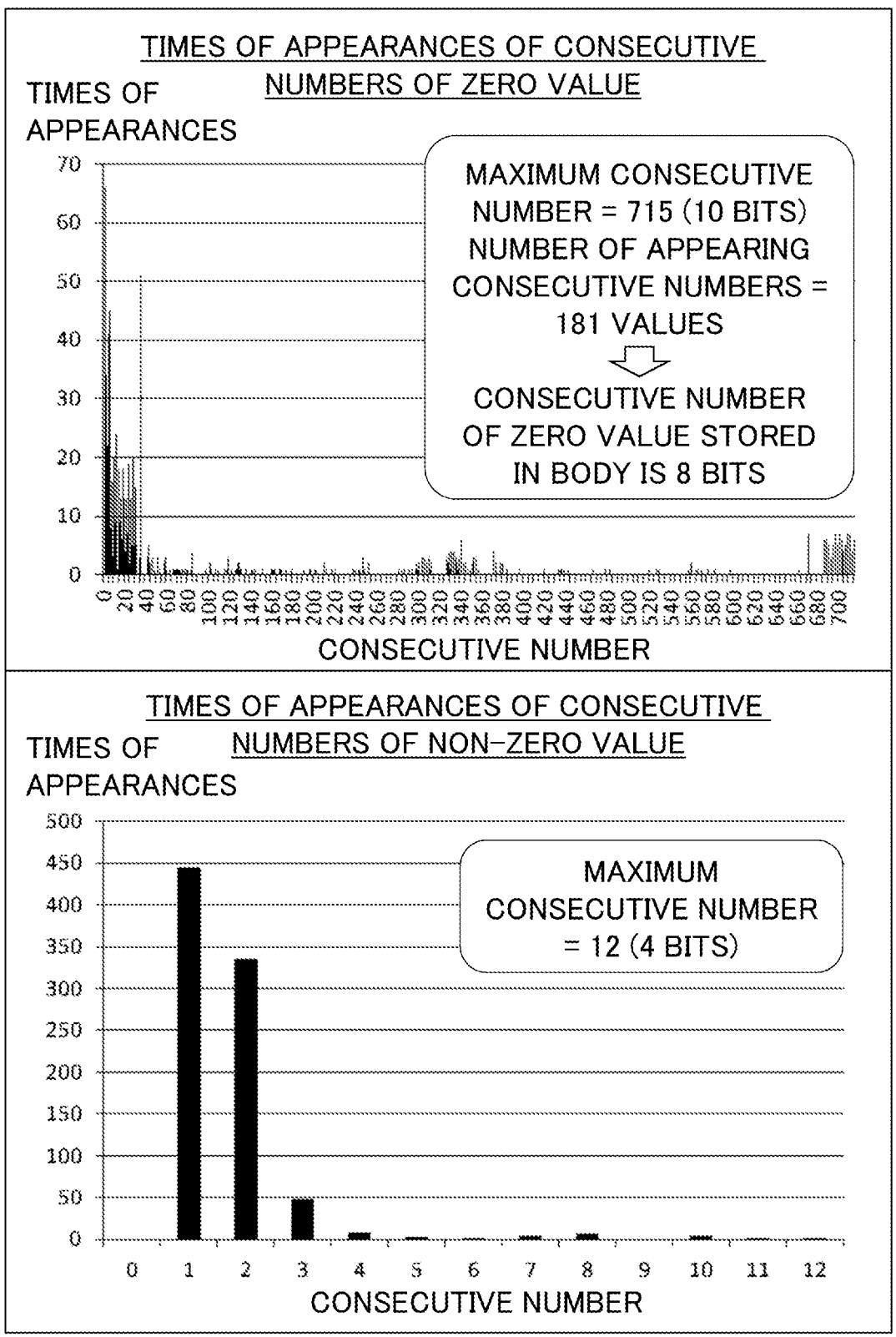
FIG. 15 is an explanatory drawing illustrating an example of differential data generated by a differential data generating unit of the data distribution device according to the third embodiment.

FIG. 15 is an explanatory drawing illustrating an example of the differential data generated by the differential data generating unit 122 of the data distribution device 100 in the third embodiment. As described with reference to FIG. 14, the maximum value of the consecutive numbers of the zero value that appear (i.e., 715) is determined based on the statistical information about the consecutive number of the zero value of the differential data sequence used to update the firmware in the past. Similarly, the maximum value of the consecutive numbers of the non-zero value that appear (i.e., 12) is determined based on the statistical information about the consecutive number of the non-zero value in the differential data sequence used to update the firmware in the past.

For example, in the differential data generated by the differential data generating unit 122, it is assumed that there are 181 values of the consecutive number of the zero value (0 to B4h). In this case, the consecutive number of the zero value stored in the body is 8 bits. Additionally, it is assumed that there are 860 combinations of zero and non-zero values in the differential data.

With respect to the above, if the consecutive number of the zero value itself, which is not the code value, is stored in the body, the number of bits used to represent 715 values of the consecutive number (00h to 2CAh) is 10 bits. Therefore, in this embodiment, 2 bits can be reduced for each combination of the zero value and the non-zero value in comparison with a case where the consecutive number of the zero values itself is stored in the body.

For example, if there are 860 combinations of the zero value and the non-zero value in the differential data, the size of the body can be reduced by 1720 bits (860×2 bits). If there are 715 values of the consecutive number, the size of the header is increased by 715 bits, as illustrated in FIG. 14. Therefore, in this embodiment, the size of the compressed data can be reduced by 125 bytes (1720−715=1005 bits) in comparison with the case where the consecutive number of the zero value itself is stored in the body.

Here, the number of values of the consecutive number of the non-zero value is 12, which is smaller than the number of values of the consecutive number of the zero value. Thus, presence information of the consecutive number of the non-zero values is not stored in the header. Therefore, the non-zero value information stored in the body of the compressed data is the same as that in FIG. 9. If the number of values of the consecutive number of the non-zero value that appear is as large as the number of values of the consecutive number of the zero value, the presence information of the consecutive number of the non-zero value may be stored in the header. In this case, in the body of the compressed data, the consecutive number of the non-zero value is represented by a minimum number of bits that can represent the number of values of the consecutive number that are actually present.

Figure 16:
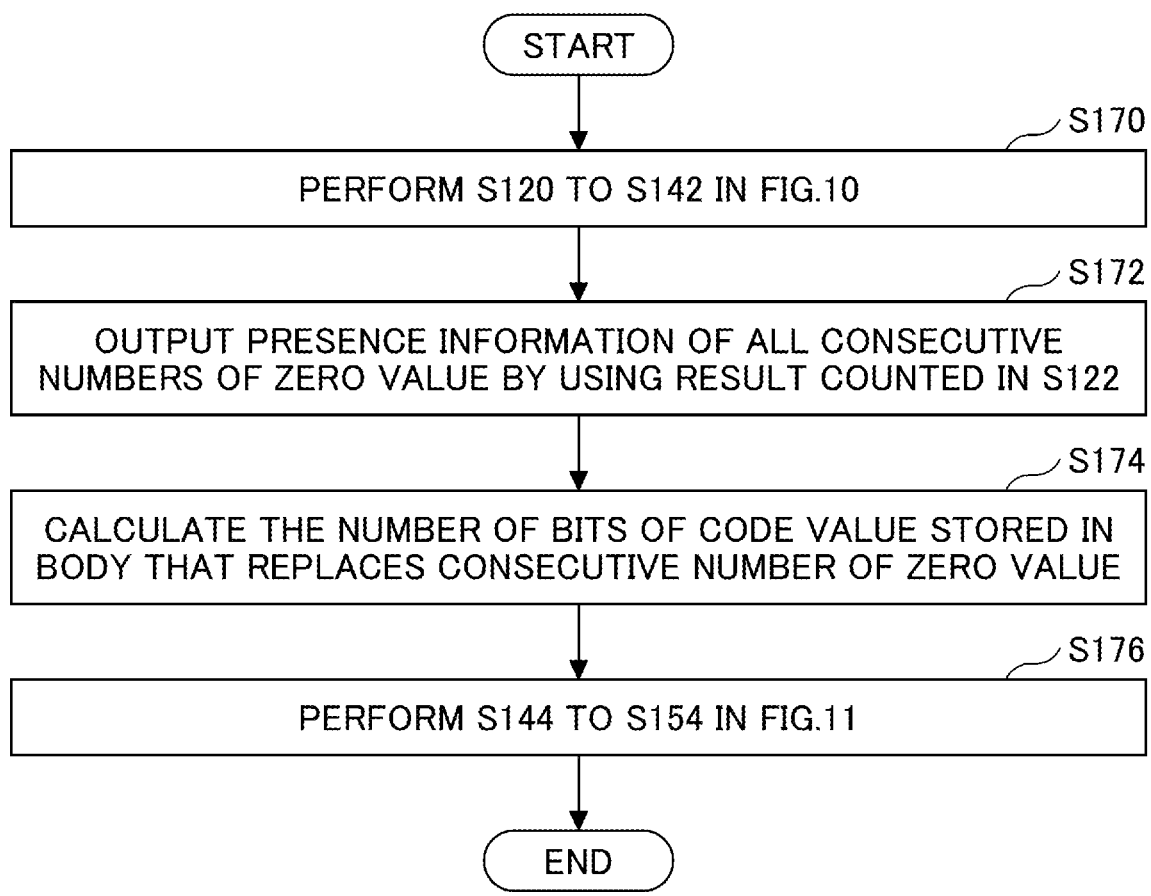
FIG. 16 is a flowchart illustrating an example of the compression process performed by a compression processing unit of the data distribution device according to the third embodiment.

FIG. 16 is a flowchart illustrating an example of the compression process performed by the compression processing unit 124 of the data distribution device 100 according to the third embodiment. That is, FIG. 16 illustrates an example of a data compression method performed by the data distribution device 100. For example, the process illustrated in FIG. 16 is achieved by the processor 102 of the data distribution device 100 executing the data compression program. For a process substantially the same as the processes of FIG. 7, FIG. 10, and FIG. 11, the detailed description is omitted.

First, in step S170, the processor 102 performs the processing in step S120 to step S142 of FIG. 10 to generate the first half of the header of the compressed data. Next, in step S172, the processor 102 uses the result of counting all consecutive numbers of the zero value in the data sequence in step S122 of FIG. 10 to generate the presence information for all values of the consecutive number of the zero value and outputs the presence information as the second half of the header.

Next, in step S174, the processor 102 calculates the number of bits of the code value to be stored in the body of the compressed data instead of the consecutive number of the zero value based on the number of values of the consecutive number of the zero value that actually appear. In the example of FIG. 14, the code value is determined to be 2 bits, and in the example of FIG. 15, the code value is determined to be 8 bits.

Next, in step S176, the processor 102 performs the processing from step S144 to step S154 of FIG. 11 to generate the body of the compressed data, outputs the generated body, and ends the compression process illustrated in FIG. 16. In step S146 of FIG. 11 that is executed in step S176, the processor 102 outputs a code value representing a consecutive number instead of outputting the actual consecutive number of the zero values.

Figure 17:
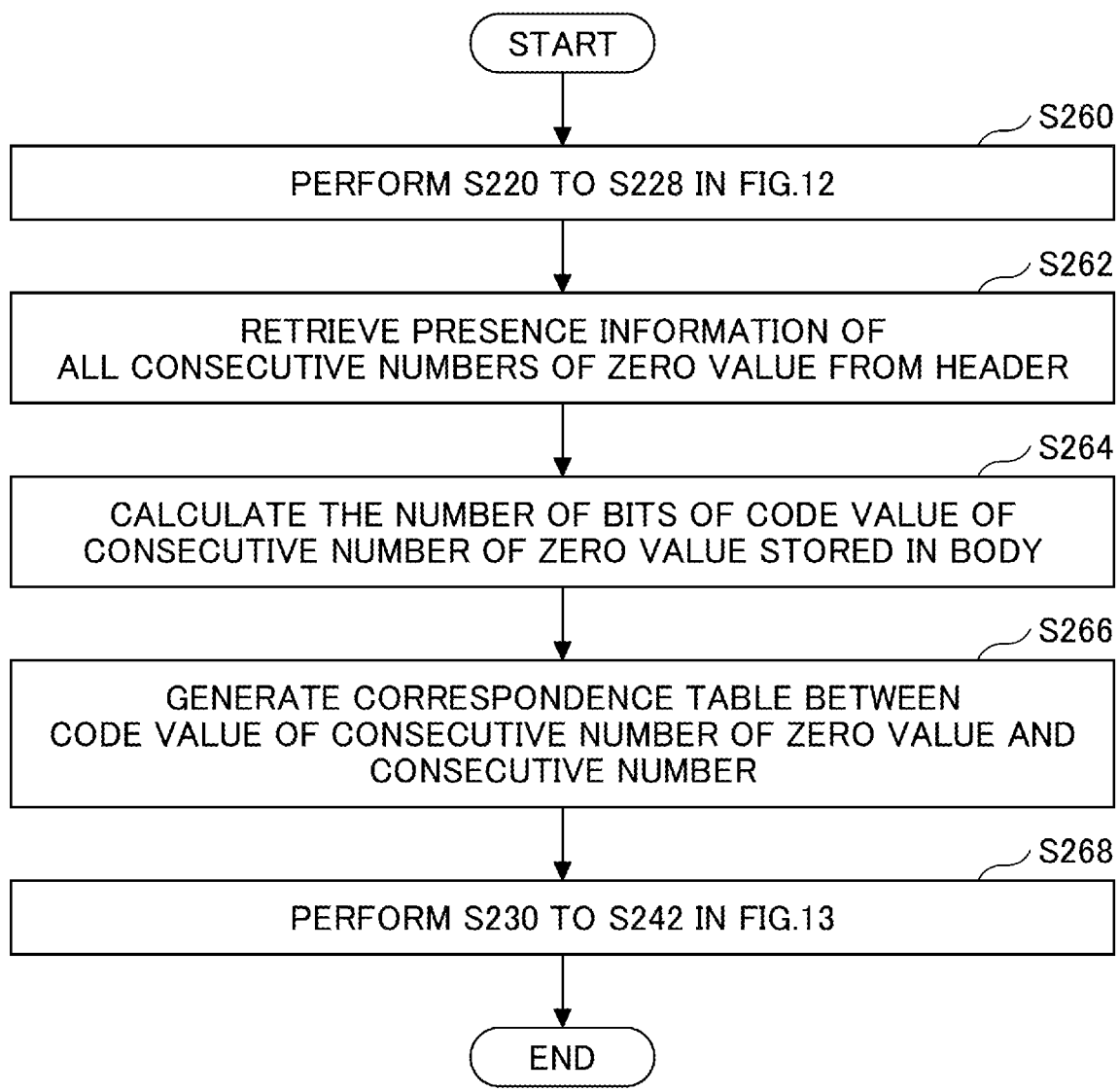
FIG. 17 is a flowchart illustrating an example of the decompression process performed by a decompression processing unit of the device according to the third embodiment.

FIG. 17 is a flowchart illustrating an example of a decompression process performed by the decompression processing unit 224 of the device 200 according to the third embodiment. That is, FIG. 17 illustrates an example of a data decompression method performed by the device 200. For example, the process illustrated in FIG. 17 is achieved by the MCU 202 of the data distribution device 100 executing the data decompression program. For processing substantially the same as the processing in FIG. 8, FIG. 12, and FIG. 13, the detailed description is omitted.

First, in step S260, the MCU 202 performs the processing from step S220 to step S228 of FIG. 12 to retrieve the first half of the header of the compressed data. Next, in step S262, the MCU 202 retrieves the presence information about all the consecutive numbers of the zero value from the second half of the header of the compressed data.

Next, in step S264, the MCU 202 calculates the number of bits of the code value representing the consecutive numbers of the zero value stored in the body of the compressed data based on the presence information retrieved in step S262. Next, in step S266, the MCU 202 generates a correspondence table between the consecutive numbers of the zero value that are actually present and the code values based on the presence information retrieved in step S262. For example, the correspondence table includes information about the "consecutive number" and the "code value of the consecutive number" illustrated in the upper right frame of FIG. 14. That is, the MCU 202 assigns a serial number to the number of the consecutive zero values that is present based on the presence information retrieved from the header.

Next, in step S268, the MCU 202 performs the decompression process of the compressed data by performing the processing from step S230 to step S242 of FIG. 13, and ends the process illustrated in FIG. 17. The MCU 202 refers to the correspondence table generated in step S266 and extracts the consecutive number of the zero value based on the code value, which is a serial number extracted from the body.

As described above, in the third embodiment, as in the above-described embodiment, only the consecutive number of the zero value is required to be arranged in the compressed data, and information representing that the value is a zero value may be removed. Additionally, by arranging the start information in the header of the compressed data, the range of the consecutive number of the zero value arranged in the body can be increased. Further, by arranging the end information in the header of the compressed data, the decompression processing unit 224 can read and discard the padding without determining that the padding is the consecutive number of the zero value if the end data is a non-zero value.

Still further, in the third embodiment, instead of the consecutive number of the zero value, the code value, in which the consecutive number that is actually present is coded, is stored in the body. Therefore, although the size of the header storing information as to whether the consecutive number of the zero value is present increases, the size of the compressed data can be further reduced in comparison with the above-described embodiments.

Fourth Embodiment

Figure 18:
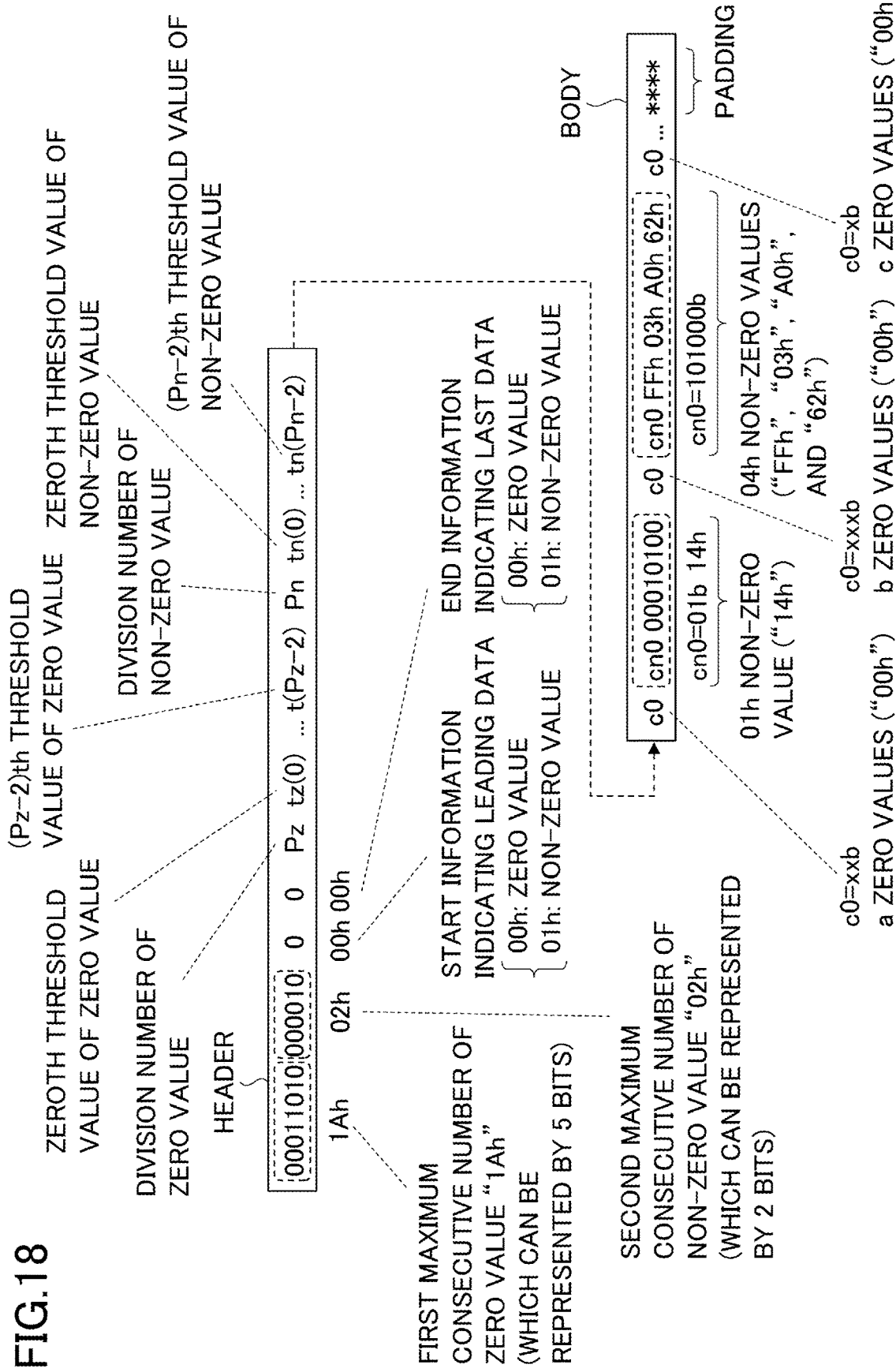
FIG. 18 is an explanatory drawing illustrating an example of a compression process performed by a data distribution device and a decompression process performed by a device in a data distribution system according to a fourth embodiment of the present disclosure.

FIG. 18 is an explanatory drawing illustrating an example of a compression process performed by a data distribution device and a decompression process performed by a device in a data distribution system according to a fourth embodiment of the present disclosure. For elements substantially the same as the elements of FIGS. 6, 9 and 14, the detailed description is omitted. In this embodiment, the size of the body of the compressed data is reduced by assigning a smaller number of bits of a code value to a consecutive number that appears at a high frequency than the number of bits of a code value assigned to a consecutive number that appears at a low frequency. Specifically, the smaller number of bits of the code value are assigned to the smaller consecutive number, instead of the consecutive number itself, and the larger number of bits of the code value are assigned to the larger consecutive number, instead of the consecutive number itself.

Here, this embodiment is similar to the Huffman code in that short codes are assigned to data that appears frequently. However, the Huffman code requires to store information indicating a Huffman tree having a large amount of data in the header, and even if the size of the body can be reduced, the entire size of the compressed code may not be reduced because the size of the header is large. Further, if a header is provided in the compressed data, the device 200 is required to allocate a memory area storing the information about the header. Thus, the size of the header is preferably smaller.

The configuration of the data distribution system SYS that performs the compression and decompression processes illustrated in FIG. 18 is substantially the same as that illustrated in FIG. 1. That is, the data distribution device 100 is substantially the same as that in FIG. 2 and FIG. 3, except that the function of the compression processing unit 124 (FIG. 3) is different from that of the first embodiment. The device 200 is substantially the same as that in FIG. 4 and FIG. 5 except that the function of the decompression processing unit 224 (FIG. 5) is different from that of the first embodiment.

In this embodiment, the header is arranged before the body, which is the compressed data, as in FIG. 9 and FIG. 14. The header includes an area in which a division number Pz obtained when all consecutive numbers of the zero value that appear are divided into multiple division groups, and a predetermined number of threshold values tz are arranged, in addition to the first maximum number, the second maximum number, the start information, and the end information illustrated in FIG. 9. The division number Pz is an example of a first division number, and groups of the consecutive numbers of the zero value that are divided by the division number Pz are an example of first groups.

The number of the zero threshold values tz is a number less than the division number Pz by "1". If the division number Pz is three or greater, the threshold values tz are from a zero threshold value tz(0) to a Pz−2 threshold value tz(Pz−2). If the division number Pz is two, the threshold value tz is only the zero threshold tz(0). The threshold value tz will be described in FIGS. 19 to 21.

Additionally, the header includes an area in which a division number Pn obtained when all consecutive numbers of the non-zero value that appear are divided into multiple division groups and a threshold value tn are arranged. The division number Pn is an example of a second division number and groups of the consecutive numbers of the non-zero value that are divided by the division number Pn are an example of second groups.

The number of the non-zero threshold values tn is a number less than the division number Pn by "1". If the division number Pn is three or greater, the threshold values tn are from a zero threshold tn(0) to a Pz−2 threshold tn(Pn−2). If the division number Pn is two, the threshold value tn is only the zero threshold tn(0). The threshold value tn will be described in FIGS. 19 to 21.

The subscript "z" indicates a parameter related to the zero value and the subscript "n" indicates a parameter related to the non-zero value. In the following, the subscript "z" or subscript "n" may be omitted if the parameter is not distinguished between the zero value and the non-zero value.

The body is substantially the same as the body of FIG. 9 and FIG. 14 except that the number of bits representing the consecutive number of the zero value and the consecutive number of the non-zero value are different from those of FIG. 9. The sign "b" outside the frame of the body indicates a binary number. The compression processing unit 124 of the data distribution device 100 determines values of the consecutive number of the zero value and the consecutive number of the non-zero value stored in the body as code values illustrated in FIG. 19 and FIG. 20, which will be described later. For example, the non-zero code values stored in the body correspond to the code values illustrated in FIG. 19.

In this embodiment, the consecutive numbers of the zero value and the consecutive numbers of the non-zero value are respectively divided into Pz groups and Pn groups. For all consecutive numbers that appear, a group having smaller consecutive numbers, which are statistically found to appear with high frequency, is represented by a smaller number of bits of a code value representing the consecutive number, and a group having larger consecutive numbers, which are statistically found to appear with low frequency, is represented by a larger number of bits of a code value representing the consecutive number.

FIG. 19 and FIG. 20 are explanatory drawings illustrating examples of code values corresponding to a consecutive number m of the zero value or the non-zero value stored in the body illustrated in FIG. 18. The code value corresponding to the consecutive number m of the zero value is an example of a first code value. The code value corresponding to the consecutive number m of the non-zero value is an example of a second code value. Because FIG. 19 and FIG. 20 are common to the zero value and the non-zero value, the subscript "z" representing the zero value and the subscript "n" representing the non-zero value are omitted.

The sign "b" illustrated in FIG. 19 and FIG. 20 indicates a binary number, and the other values are shown as a decimal number. In FIG. 19 and FIG. 20, for simplicity of description, a code value "00b" is assigned to a consecutive number m="0" that is not present and consecutive numbers up to a consecutive number m="12" are supported. In practice, however, the code value="00b" is assigned to the consecutive number m="1", and code values are sequentially assigned to consecutive numbers m="2" to "13", so that consecutive numbers up to the consecutive number m="13" can be supported.

FIG. 19 illustrates an example of a case in which the division number P is two. If the division number P is two, there are two division groups. In FIG. 19, one threshold value t(0)="3" is used. The threshold value t(0)="3" illustrated shaded in FIG. 19 is equal to a data value v(0)="3" at which the use of 4 bits representing a data value v(1) is started, in sequentially increasing the consecutive number m.

A zeroth division group includes the consecutive numbers m="1" and "2", and is represented by a 2-bit code value represented by the data value v(0). The first division group includes the consecutive numbers m="3" to "12" and is represented by a 6-bit code value in which the 2 bits indicated by the data value v(0) and the 4 bits indicated by the data value v(1) are combined.

FIG. 20 illustrates an example of a case in which the division number P is three. If the division number P is three, there are three division groups. In FIG. 20, two threshold values t(0)="2", and t(1)="1" are used. The threshold value t(0)="2" illustrated shaded in FIG. 20 is equal to the data value v(0) at which the use of one bit representing the data value v(1) is started, in sequentially increasing the consecutive number m. Similarly, the threshold value t(1)="1" illustrated shaded in FIG. 20 is equal to the data value v(1)="1" at which the use of 3 bits representing the data value v(2) is started, in sequentially increasing the consecutive number m.

The zeroth division group includes the consecutive number m="1" and is represented by a two-bit code value represented by the data value v(0). The first division group includes the consecutive numbers m="2" and "3" and is represented by a three-bit code value in which the two bits represented by the data value v(0) and the one bit indicated by the data value v(1) are combined. The second division group includes the consecutive numbers m="4" to "12" and is represented by a 6-bit code value in which two bits represented by the data value v(0), one bit represented by the data value v(1), and three bits represented by the data value v(2) are combined.

The compression processing unit 124 of the data distribution device 100 stores the code values represented by a binary number in the body of the compressed data in accordance with the consecutive number m appearing in the differential data. For example, the compression processing unit 124 determines the code value corresponding to the consecutive number m by searching in the corresponding table between the consecutive number m and the code value.

The compression processing unit 124 determines a combination (i.e., an optimum solution) that minimizes the average number of bits of the code values from among multiple combinations of the division number P and the threshold value t(p) of the division group by searching. At this time, the compression processing unit 124 may select an optimum correspondence table from among multiple correspondence tables, including the consecutive number m and the code value, that are provided in advance based on multiple division numbers P and threshold values t.

As illustrated in FIG. 19 and FIG. 20, in the differential data indicating the difference in the data between the old firmware and the new firmware, the number of appearances of smaller consecutive numbers m may be greater, and the number of appearances of larger consecutive numbers m may be less. In this case, by reducing the number of bits of the code value assigned to the division group corresponding to the smaller consecutive numbers m in comparison with the number of bits of the code value assigned to the division group corresponding to the larger consecutive number m, the average number of bits of the code value representing the consecutive number m can be reduced. As a result, the size of the body of the compressed data can be reduced. Here, the compression processing unit 124 employs an example of FIG. 19 that has a small average number of bits by searching for the optimal solution from among examples of FIG. 19 and FIG. 20.

FIG. 21 is an explanatory drawing illustrating an example of a mathematical expression used when the decompression processing unit 224 of the device 200 extracts the consecutive numbers from the code values. Because FIG. 21 is common to the zero value and the non-zero value, the subscript "z" representing the zero value and the subscript "n" representing the non-zero value may be omitted. The sign M represents the maximum value of the consecutive number m, and M is "12" in FIG. 19 and FIG. 20. The sign m represents each of the consecutive numbers and is represented by "1" to "M". The sign P represents the number of divisions. The sign p represents a division group number and is represented by "0" to "P−1".

The sign t(p) represents a $p^{th}$ threshold value t, and there is only t(0) in FIG. 19, and there are t(0) and t(1) in FIG. 20. Here, the threshold value tz(p) of the zero value is an example of a first bit number information indicating the number of bits of the code value assigned to each division group. The threshold value tn(p) of the non-zero value is an example of a second bit number information indicating the number of bits of the code value assigned to each division group.

The sign v(p) represents a data value constituting the code value, represented by "0 to a threshold value t(p)−1". The number of the data values v(p) constituting the code value increments by one as the division group number increases and the data value v(p) reaches the threshold value t(p).

In FIG. 19, because of the threshold value t(0)="3", it is found that the data value v(0) is any one of "0", "1", or "2", which is smaller than the threshold value t(0), and is represented by two bits. In practice, the data value v(0)="0" is not used. Therefore, the consecutive number m of the zeroth division group is either "1" or "2" by using the data value v(0).

In FIG. 19, the data value v(1) is not obtained from the threshold value t(1) because there is no threshold value t(1). However, it is found that the data value v(1) is the last data value because there is no threshold value t(1). The last data value v(1) is represented, for example, by the number of bits (e.g., 4 bits) that can represent the maximum value M of the consecutive number. The data value v(1) is any of "0" to "9" corresponding to consecutive numbers from the consecutive number m="3" to the maximum value of the consecutive number M="12", which are not represented by the zeroth division group. Therefore, the consecutive number m of the first division group is any one of "3" to "12" by using the data values v(0)="3" and the data values v(1)="0" to "9".

In FIG. 20, because of the threshold value t(0)="2", it is found that the data value v(0) is either "0" or "1" that is less than the threshold value t(0), and is represented by one bit. Therefore, the consecutive number m of the zeroth division group is only "1" by using the data value v(0).

In FIG. 20, because of the threshold value t(1)="1", it is found that the data value v(1) is only "0" that is less than the threshold value t(0), and is represented by one bit. Therefore, the consecutive numbers m of the first division group are "2" and "3" by using the data values v(0) and v(1).

In FIG. 20, because there is no threshold value t(2), the data value v(2) is not obtained from the threshold value t(2). However, it is found that the data value v(2) is the last data value because there is no threshold value t(2). The last data value v(2) is represented by, for example, three bits. Therefore, the consecutive numbers m of the second division group are "4" to "12" by using the data values v(0), v(1), and v(2).

The sign r(p) represents a coefficient to be multiplied with each of the data values v(1) and v(2) when the consecutive number m is calculated from the code value by using the mathematical expression. For example, the coefficient r(p) is obtained by subtracting the threshold t(p) from the smallest power of two above the threshold t(p). In FIG. 19, the coefficient r(0) is "1". In FIG. 20, the coefficient r(0) is "2", and the coefficient r(1) is "1".

The decompression processing unit 224 first obtains the division number P and the threshold value t(p) corresponding to the division number P from the header when the differential data included in the compressed data is decompressed. Next, the decompression processing unit 224 calculates the coefficient r(p) from the threshold value t(p). Then, the decompression processing unit 224 applies the threshold value t(p) and the calculated coefficient r(p) to the mathematical expression held in advance, and determines the consecutive number m assigned to each division group.

In practice, the decompression processing unit 224 retrieves a code value corresponding to the consecutive number from the body by one bit until the consecutive number m corresponding to the code value is determined. For example, if the division number P="2" and the threshold value t(0)="3" (FIG. 19), the consecutive number is determined as follows.

If a first bit of the code value is "0", the decompression processing unit 224 determines that the consecutive number m is "1". If the first bit of the code value is "1", the decompression processing unit 224 retrieves a next bit (i.e., a second bit). If the second bit is "0", the decompression processing unit 224 determines that the consecutive number m is "2".

If the second bit is "1", the decompression processing unit 224 retrieves next four bits (i.e., a third bit to a sixth bit). Then, the decompression processing unit 224 determines that the consecutive number m is any one of "3" to "12" in accordance with data values represented by the third bit to the sixth bit.

If the division number P is "3", the threshold value t(0)="2", and the threshold value t(1)="1" are used (FIG. 20), the consecutive number is determined as follows. If the first bit (the first bit) of the code value is "0", the decompression processing unit 224 determines that the consecutive number is "1". If the first bit is "1", the decompression processing unit 224 retrieves the next two bits (i.e., the second bit and the third bit). If the third bit is "0", the decompression processing unit 224 determines that the consecutive number m is "2" or "3" in accordance with the value of the second bit.

If the third bit is "1", the decompression processing unit 224 retrieves the fourth bit to the sixth bit. The decompression processing unit 224 determines that the consecutive number m is any one of "4" to "12" in accordance with the data values represented by the second bit and the fourth bit to the sixth bit.

As described above, the decompression processing unit 224 can determine the consecutive number m from a bit value of a different code value for each division group to which the consecutive number m belongs based on a predetermined rule determined based on the division number P and the threshold value t(p).

FIG. 22 is a flowchart illustrating an example of the compression process performed by the compression processing unit 124 of the data distribution device 100 according to the fourth embodiment. That is, FIG. 22 illustrates an example of the data compression method performed by the data distribution device 100. For example, the process illustrated in FIG. 22 is achieved by the processor 102 of the data distribution device 100 executing the data compression program. For processing substantially the same as the processing in FIGS. 7, 10, 11, and 16, the detailed description is omitted.

First, in step S180, the processor 102 performs the processing from step S120 to step S142 of FIG. 10 to generate the first half of the header of the compressed data. Next, in step S182, the processor 102 searches for the optimum solution of the division number Pz of the consecutive number of the zero value and the threshold value tz stored in the header based on all consecutive numbers of the zero value counted in step S122 (FIG. 10). The processor 102 searches for the optimal solution of the division number Pn of the consecutive number of the non-zero value and the threshold value tn stored in the header based on all consecutive numbers of the non-zero value counted in step S126 (FIG. 10).

Next, in step S184, the processor 102 outputs, as the second half of the header, the division number Pz, the threshold value tz, the division number Pn, and the threshold value tn obtained as the optimum solution in step S182. Here, the optimum solution is the division number Pz and the threshold value tz for the zero value, and the division number Pn and the threshold value tn for the non-zero value, by which the size of the compressed data is smallest.

Next, in step S186, the processor 102 generates a code value of a consecutive number of the zero value based on the optimal solution obtained by searching in step 182. The processor 102 also generates a code value of a consecutive number of the non-zero value based on the optimum solution obtained by searching in step 182.

Next, in step S188, the processor 102 performs the processing from step S144 to step S154 of FIG. 11 to generate the body of the compressed data, outputs the generated body, and ends the compression process illustrated in FIG. 22.

In step S146 in FIG. 11 being executed in step S188, instead of outputting the actual consecutive number of the zero value, the processor 102 outputs a code value representing the consecutive number of the zero value. In step S150 of FIG. 11 being executed in step S188, instead of outputting the actual consecutive number of the non-zero value, the processor 102 outputs a code value representing the consecutive number of the non-zero value.

FIG. 23 is a flowchart illustrating an example of the decompression process performed by the decompression processing unit 224 of the device 200 according to the fourth embodiment. That is, FIG. 23 illustrates an example of a data decompression method performed by the device 200. For example, the process illustrated in FIG. 23 is achieved by the MCU 202 of the data distribution device 10 executing the data decompression program. For processing substantially the same as the processing as FIGS. 8, 12, 13, and 17, the detailed description is omitted.

First, in step S270, the MCU 202 performs the processing from step S220 to step S228 in FIG. 12 to retrieve the first maximum number, the second maximum number, the start information, and the end information, which are the first half of the header of the compressed data. Next, in step S272, the MCU 202 retrieves the division number Pz and the threshold value tz of the consecutive number of the zero value and the division number Pn and the threshold value tn of the consecutive number of the non-zero value, which are the second part of the header of the compressed data.

Next, in step S274, the MCU 202 performs the processing from steps S230 to S242 in FIG. 13 to perform the decompression process of the compressed data, and ends the process illustrated in FIG. 23. In step S232 in FIG. 13 executed in step S274, the MCU 202 obtains a consecutive number of the zero value corresponding to a code value retrieved from the body based on the division number Pz and the threshold value tz of the zero value according to the method described in FIG. 21.

Similarly, in step S238 in FIG. 13 executed in step S274, the MCU 202 obtains a consecutive number of the non-zero value corresponding to a code value retrieved from the body based on the division number Pn and the threshold value tn of the non-zero value according to the method described in FIG. 21.

As described above, in the fourth embodiment, as in the above-described embodiments, only the consecutive number of the zero value is required to be arranged in the compressed data for the zero value, and information representing that the value is a zero value may be removed. Additionally, by arranging the start information in the header of the compressed data, the range of the consecutive number arranged in the body can be increased. Further, by arranging the end information in the header of the compressed data, the decompression processing unit 224 can read and discard the padding without determining that the padding is the consecutive number of the zero value if the end data is a non-zero value.

Further, in the fourth embodiment, the size of the body can be further reduced by reducing the number of bits of code values corresponding to the consecutive numbers that empirically appear with high frequency. At this time, the consecutive numbers are divided into multiple groups in order from a smallest number to a largest number, and the number of bits of a code value to be assigned to a group of the smaller consecutive numbers is smaller than the number of bits of a code value to be assigned to a group of the larger consecutive numbers. This can minimize the number of bits of code values of the consecutive numbers of the zero value and the non-zero value stored in the body instead of the consecutive number, and minimize the size of the body. As a result, the size of the compressed data can be further reduced in comparison with the embodiments described above.

In the fourth embodiment described above, the example, in which code values replacing both the consecutive number of the zero value and the consecutive number of the non-zero value are generated based on the division numbers Pz and Pn, and the threshold values tz and tn, is described. However, code values replacing either the consecutive number of the zero value or the consecutive number of the non-zero value may be generated.

Although the invention has been described according to the embodiments, the invention is not limited to the requirements illustrated in the embodiments. In these respects, various modifications can be made within the scope of the subject matter of the present invention and may be suitably defined according to its application.

What is claimed is:

1. A data compression method comprising:
    inputting a data sequence that includes first data strings and second data strings alternating with each other, each of the first data strings containing one or more first data all of which have a same predetermined value, and each of the second data strings containing one or more second data which are different from the predetermined value;
    determining first numbers and second numbers from a beginning of the input data sequence sequentially, each of the first numbers being a number of the first data in a respective one of the first data strings, and each of the second numbers being a number of the second data in a respective one of the second data strings; and
    arranging the first numbers, the second numbers, and the second data strings in a cyclic manner to generate compressed data such that each cycle includes one of the first numbers, one of the second numbers, and one of the second data strings containing one or more second data that are equal in number to the one of the second numbers.

2. The data compression method as claimed in claim 1, further comprising:
    calculating a first maximum number, the first maximum number being a maximum value of the first numbers;
    arranging a header before a body in which the compressed data is arranged, the header including the calculated first maximum number; and
    representing the first numbers arranged in the body by using a minimum number of bits that can represent the first maximum number.

3. The data compression method as claimed in claim 2, further comprising:
    calculating a second maximum number, the second maximum number being a maximum value of the second numbers;
    arranging the calculated second maximum number in the header; and
    representing the second numbers arranged in the body by using a minimum number of bits that can represent the second maximum number.

4. The data compression method as claimed in claim 2, further comprising:

arranging presence information in the header, the presence information indicating whether each of the first numbers is present as a number of the first data in a corresponding one of the first data strings included in the data sequence;

assigning serial numbers to the first numbers that are present; and arranging the serial numbers in the body instead of the first numbers.

5. The data compression method as claimed in claim 1, further comprising:

searching for a combination of a first division number and a number of bits for each of first code values assigned to the plurality of first groups, so that a size of the compressed data becomes minimum, the first division number being a number of a plurality of first groups, in a case where the first numbers that appear are divided into the plurality of first groups in order from a smallest value, a corresponding value of the first code values is assigned to each of the first numbers that appear to arrange the first code values instead of the first numbers to generate the compressed data, the number of bits of the corresponding value of the first code values is different for each of the plurality of first groups, and the number of bits of the corresponding value of the first code values decreases as a first group to which the corresponding value is assigned among the plurality of first groups includes a smaller value of the first numbers;

arranging a header before a body in which the compressed data is arranged, the header including the searched first division number and first bit number information, and the first bit number information indicating the number of bits for each of the first code values assigned to the plurality of first groups; and arranging the first code values in the body instead of the first numbers.

6. The data compression method as claimed in claim 5, further comprising:

searching for a combination of a second division number of a plurality of second groups and a number of bits for each of second code values assigned to the plurality of second groups, so that the size of the compressed data becomes minimum, in a case where the second numbers that appear are divided into the plurality of second groups in order from a smallest value, a corresponding value of the second code values is assigned to each of the second numbers that appear to arrange the second code values instead of the second numbers to generate the compressed data, the number of bits of the corresponding value of the second code values is different for each of the plurality of second groups, and the number of bits of the corresponding value of the second code values decreases as a second group to which the corresponding value of the second code values is assigned among the plurality of second groups includes a smaller value of the second numbers;

arranging the header before the body in which the compressed data is arranged, the header including the searched second division number and second bit number information, and the second bit number information indicating the number of bits for each of the second code values assigned to the plurality of second groups; and arranging the second code values in the body instead of the second numbers.

7. The data compression method as claimed in claim 2, further comprising:

arranging start information in the header, the start information indicating whether leading data of the data sequence is the first data or the second data;

arranging one of the first numbers, one of the second numbers, and one of the second data strings, or one of the second numbers, one of the second data strings, and one of the first numbers sequentially in accordance with the start information to generate the compressed data.

8. The data compression method as claimed in claim 7, further comprising:

arranging end information in the header, the end information indicating whether last data of the data sequence is the first data or the second data;

arranging one of the first numbers or one of the second numbers and one of the second data strings in the last data of the compressed data in accordance with the end information; and adding padding to the last data of the compressed data, in a case where the last data of the compressed data is not byte data.

9. The data compression method as claimed in claim 1, wherein the data sequence is differential data obtained by comparing data to be updated and updated data.

10. A data compression device comprising:

a processor; and a memory storing program instructions that cause the processor to:

input a data sequence that includes first data strings and second data strings alternating with each other, each of the first data strings containing one or more first data all of which have a same predetermined value, and each of the second data strings containing one or more second data which are different from the predetermined value;

determine first numbers and second numbers from a beginning of the input data sequence sequentially, each of the first numbers being a number of the first data in a respective one of the first data strings, and each of the second numbers being a number of the second data in a respective one of the second data strings; and arrange the first numbers, the second numbers, and the second data strings in a cyclic manner to generate compressed data such that each cycle includes one of the first numbers, one of the second numbers, and one of the second data strings containing one or more second data that are equal in number to the one of the second numbers.

11. A non-transitory computer-readable recording medium having stored therein a data compression program for causing a computer to perform a process comprising:

inputting a data sequence that includes first data strings and second data strings alternating with each other, each of the first data strings containing one or more first data all of which have a same predetermined value, and each of the second data strings containing one or more second data which are different from the predetermined value;

determining first numbers and second numbers from a beginning of the input data sequence sequentially, each of the first numbers being a number of the first data in a respective one of the first data strings, and each of the second numbers being a number of the second data in a respective one of the second data strings; and arranging the first numbers, the second numbers, and the second data strings in a cyclic manner to generate compressed data such that each cycle includes one of the first numbers, one of the second numbers, and one of the second data strings containing one or more second data that are equal in number to the one of the second numbers.

12. A data decompression method of decompressing compressed data in which, based on a data sequence that includes first data strings and second data strings alternating with each other, first numbers, second numbers, and the second data strings are arranged from a beginning of the data sequence in a cyclic manner such that each cycle includes one of the first numbers, one of the second numbers, and one of the second data strings containing one or more second data that are equal in number to the one of the second numbers, each of the first data strings containing one or more first data all of which have a same predetermined value, each of the second data strings containing one or more second data which are different from the predetermined value, each of the first numbers being a number of the first data in a respective one of the first data strings, and each of the second numbers being a number of the second data in a respective one of the second data strings, wherein the data decompression method comprises:
inputting the compressed data; and
decoding one or more first data that are equal in number to a first number and retrieving one or more second data that are equal in number to a second number from the compressed data to decode the data sequence, the first number being from among the first numbers, and the second number being from among the second numbers.

13. The data decompression method as claimed in claim 12, further comprising:
inputting a first maximum number included in a header arranged before a body in which the compressed data is arranged, the first maximum number being a maximum value of the first numbers;
calculating a minimum first bit number that can represent the first maximum number, and
retrieving each of the first numbers represented by the calculated first bit number from the compressed data to decode the first data.

14. The data decompression method as claimed in claim 13, further comprising:
inputting a second maximum number included in the header, the second maximum number being a maximum value of the second numbers;
calculating a minimum second bit number that can represent the second maximum number,
retrieving each of the second numbers represented by the calculated second bit number from the compressed data, and
retrieving one or more second data that are equal in number to the retrieved second number from the compressed data.

15. The data decompression method as claimed in claim 13, further comprising:
inputting presence information included in the header, the presence information indicating whether each of the first numbers is present as a number of the first data in a corresponding one of the first data strings included in the data sequence;
assigning serial numbers to the first numbers that are present based on the presence information; and
extracting the first numbers based on the serial numbers included in the body.

16. The data decompression method as claimed in claim 12, further comprising:

inputting a first division number and first bit number information, the first division number and the first bit number information being included in a header arranged before a body in which the compressed data is arranged, the first division number being a number of a plurality of first groups, the first numbers that appear being divided into the plurality of first groups in order from a smallest value, the first bit number information indicating a number of bits for each of first code values assigned to the first numbers that appear, the number of bits of a corresponding value of the first code values being different for each of the plurality of first groups, and the number of bits of the corresponding value of the first code values decreasing as a first group to which the corresponding value of the first code values is assigned among the plurality of first groups includes a smaller value of the first numbers; and
extracting the first numbers from the first code values included in the body by using the first division number and the first bit number information.

17. The data decompression method as claimed in claim 16, further comprising:
inputting a second division number and second bit number information, the second division number and the second bit number information being included in the header, the second division number being a number of a plurality of second groups, the second numbers that appear being divided into the plurality of second groups in order from a smallest value, the second bit number information indicating a number of bits for each of second code values assigned to the second numbers that appear, the number of bits of a corresponding value of the second code values being different for each of the plurality of second groups, and the number of bits of the corresponding value of the second code values decreasing as a second group to which the corresponding value of the second code values is assigned among the plurality of second groups includes a smaller value of the second numbers; and
extracting the second numbers from the second code values included in the body by using the second division number and the second bit number information.

18. A data decompression device of decompressing compressed data in which, based on a data sequence that includes first data strings and second data strings alternating with each other, first numbers, second numbers, and the second data strings are arranged from a beginning of the data sequence in a cyclic manner such that each cycle includes one of the first numbers, one of the second numbers, and one of the second data strings containing one or more second data that are equal in number to the one of the second numbers, each of the first data strings containing one or more first data all of which have a same predetermined value, each of the second data strings containing one or more second data which are different from the predetermined value, each of the first numbers being a number of the first data in a respective one of the first data strings, and each of the second numbers being a number of the second data in a respective one of the second data strings,
wherein the data decompression device comprises:
a processor; and
a memory storing program instructions that cause the processor to:
input the compressed data; and
decode one or more first data that are equal in number to a first number and retrieve one or more second data that are equal in number to a second number from the compressed data to decode the data sequence, the first number being from among the first numbers, and the second number being from among the second numbers.

19. A non-transitory computer-readable recording medium having stored therein a data decompression program of decompressing compressed data in which, based on a data sequence that includes first data strings and second data strings alternating with each other, first numbers, second numbers, and the second data strings are arranged from a beginning of the data sequence in a cyclic manner such that each cycle includes one of the first numbers, one of the second numbers, and one of the second data strings containing one or more second data that are equal in number to the one of the second numbers, each of the first data strings containing one or more first data all of which have a same predetermined value, each of the second data strings containing one or more second data which are different from the predetermined value, each of the first numbers being a number of the first data in a respective one of the first data strings, and each of the second numbers being a number of the second data in a respective one of the second data strings, wherein the data decompression program causes a computer to perform a process comprising:

inputting the compressed data; and decoding one or more first data that are equal in number to a first number and retrieving one or more second data that are equal in number to a second number from the compressed data to decode the data sequence, the first number being from among the first numbers, and the second number being from among the second numbers.

\* \* \* \* \*